(12) United States Patent
Yoshida

(10) Patent No.: US 10,497,905 B2
(45) Date of Patent: Dec. 3, 2019

(54) ORGANIC ELECTROLUMINESCENCE DISPLAY DEVICE HAVING ENHANCED VISIBILITY OF BLACK FROM AN OBLIQUE DIRECTION

(71) Applicant: FUJIFILM Corporation, Tokyo (JP)

(72) Inventor: Shinpei Yoshida, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/824,255

(22) Filed: Nov. 28, 2017

(65) Prior Publication Data

US 2018/0159085 A1  Jun. 7, 2018

Related U.S. Application Data

(63) Continuation of application No. PCT/JP2016/065690, filed on May 27, 2016.

(30) Foreign Application Priority Data

May 29, 2015  (JP) .................... 2015-109824

(51) Int. Cl.
*G02B 5/30* (2006.01)
*G09F 9/00* (2006.01)
(Continued)

(52) U.S. Cl.
CPC .......... *H01L 51/5281* (2013.01); *G02B 5/30* (2013.01); *G02B 5/3025* (2013.01); *G06F 3/041* (2013.01);
(Continued)

(58) Field of Classification Search
CPC ... H01L 51/5281; H01L 27/32; H01L 27/323; H01L 51/50; H01L 51/5253; H01L 33/02;
(Continued)

(56) References Cited

U.S. PATENT DOCUMENTS 4,966,442 A * 10/1990 Ono .................. G02F 1/133345
  349/122
8,681,295 B2 * 3/2014 Ishiguro ................ G02F 1/1393
  349/117
(Continued)

FOREIGN PATENT DOCUMENTS

JP  2003-262727 A  9/2003
JP  2004-198614 A  7/2004
(Continued)

OTHER PUBLICATIONS

International Search Report issued in PCT/JP2016/065690 dated Aug. 16, 2016.
(Continued)

*Primary Examiner* — Ismail A Muse
*Assistant Examiner* — Charles N Ausar-El
(74) *Attorney, Agent, or Firm* — Edwards Neils LLC; Jean C. Edwards, Esq.

(57) ABSTRACT

An organic electroluminescence display device includes, from a visible side, at least: a circular polarization plate; and an organic electroluminescence display element having a pair of electrodes and an organic light emitting layer sandwiched therebetween. A high refractive index layer has a refractive index of greater than 1.7 and less than 2.1 is disposed between the plate and one of the electrodes on the visible side, the plate has a polarizer, a λ/2 plate, and a λ/4 plate in this order from the visible side, a retardation RthA (550) of the λ/2 plate in a thickness direction at a wavelength of 550 nm is within a range of greater than −120 nm and less than −40 nm, and a retardation RthB (550) of the λ/4 plate in a thickness direction at a wavelength of 550 nm is within a range of greater than −60 nm and less than 20 nm.

8 Claims, 2 Drawing Sheets

(51) Int. Cl.
*G09F 9/30* (2006.01)
*G06F 3/041* (2006.01)
*H01L 27/32* (2006.01)
*H01L 51/50* (2006.01)
*H01L 51/52* (2006.01)
*H05B 33/02* (2006.01)
*H05B 33/04* (2006.01)

(52) U.S. Cl.
CPC ............... *G09F 9/00* (2013.01); *G09F 9/30* (2013.01); *H01L 27/32* (2013.01); *H01L 27/323* (2013.01); *H01L 51/50* (2013.01); *H01L 51/5262* (2013.01); *H05B 33/02* (2013.01); *H05B 33/04* (2013.01); *H01L 51/5253* (2013.01)

(58) Field of Classification Search
CPC ....... H01L 33/04; H01L 51/5262; G02B 5/30; G02B 5/3025; G06F 3/041; G09F 9/00; G09F 9/30; H05B 33/02; H05B 33/04
See application file for complete search history.

(56) References Cited

U.S. PATENT DOCUMENTS

| | | | | |
|---|---|---|---|---|
| 8,691,351 B2* | 4/2014 | Asakura | ................ | G02B 1/111 359/586 |
| 9,064,826 B2* | 6/2015 | Nakazawa | ........... | G02B 5/3025 |
| 9,419,244 B2* | 8/2016 | Lang | ................ | H01L 51/5253 |
| 9,563,000 B2* | 2/2017 | Ko | ................ | G02B 5/3083 |
| 10,132,974 B2* | 11/2018 | Furuki | ................ | B32B 7/02 |
| 2003/0116270 A1* | 6/2003 | Hawa | ................ | G02B 1/111 156/307.1 |
| 2007/0054066 A1* | 3/2007 | Usukura | ............. | G02B 5/3083 428/1.31 |
| 2008/0158490 A1* | 7/2008 | Nakayama | ............. | B29C 55/08 349/117 |
| 2011/0222155 A1* | 9/2011 | Sakai | ................ | G02B 5/3083 359/489.07 |
| 2012/0182507 A1* | 7/2012 | Nakayama | .......... | G02F 1/13363 349/117 |
| 2012/0236235 A1* | 9/2012 | Ishiguro | ............... | G02B 5/3033 349/96 |
| 2013/0163032 A1* | 6/2013 | Hamano | ............... | G06F 3/1296 358/1.14 |
| 2013/0321723 A1* | 12/2013 | Ishiguro | ................ | G02B 27/26 349/15 |
| 2014/0132897 A1* | 5/2014 | Oya | ................ | G02B 5/305 349/96 |
| 2014/0168768 A1* | 6/2014 | Seo | ................ | G02B 5/3083 359/489.07 |
| 2014/0168769 A1* | 6/2014 | Seo | ................ | G02B 5/3083 359/489.07 |
| 2014/0375935 A1* | 12/2014 | Yamada | ................ | G02B 5/3025 349/103 |
| 2015/0054750 A9* | 2/2015 | Liu | ................ | G06F 3/041 345/173 |
| 2015/0168624 A1* | 6/2015 | Yaginuma | ................ | G02B 1/04 359/489.07 |
| 2015/0205028 A1* | 7/2015 | Kobayashi | ........... | G02B 5/3083 359/489.02 |
| 2015/0212246 A1* | 7/2015 | Yoshida | ............... | G02B 5/3016 349/194 |
| 2015/0247963 A1* | 9/2015 | Fujisawa | .............. | C07D 265/22 359/489.07 |
| 2015/0369981 A1* | 12/2015 | Takeda | ................ | G02B 5/305 359/488.01 |
| 2016/0070030 A1* | 3/2016 | Fujisawa | .............. | C07D 231/12 359/489.07 |
| 2016/0070383 A1* | 3/2016 | Toyoshima | ........... | H01L 27/323 345/174 |
| 2016/0085100 A1* | 3/2016 | Toyoshima | ........... | H01L 27/323 349/12 |
| 2016/0146995 A1* | 5/2016 | Kasai | .................. | G02B 5/3016 349/194 |
| 2016/0223719 A1* | 8/2016 | Ishiguro | .................... | B32B 7/02 |
| 2016/0283025 A1* | 9/2016 | Yang | ...................... | G06F 3/044 |
| 2017/0031062 A1* | 2/2017 | Namiki | ............... | H01L 51/5275 |
| 2017/0147116 A1* | 5/2017 | Lee | ................ | H01L 27/323 |
| 2017/0303349 A1* | 10/2017 | Kim | ................ | H05B 33/02 |
| 2018/0003866 A1* | 1/2018 | Ahn | ................ | B32B 7/12 |
| 2018/0003875 A1* | 1/2018 | Furuki | ...................... | B32B 7/02 |
| 2018/0031748 A1* | 2/2018 | Cho | ................ | G02B 1/11 |
| 2018/0047945 A1* | 2/2018 | Hack | ................ | H01L 27/3232 |
| 2018/0093404 A1* | 4/2018 | Hatano | .................. | B29C 48/18 |
| 2018/0329124 A1* | 11/2018 | Iida | ................ | G02B 5/3016 |
| 2019/0072701 A1* | 3/2019 | Murashige | ............... | G02B 5/30 |

FOREIGN PATENT DOCUMENTS

| | | | | |
|---|---|---|---|---|
| WO | 2013/100115 A1 | 7/2013 | | |
| WO | WO 2013100115 A1 * | 7/2013 | ........... | G02B 5/3083 |

OTHER PUBLICATIONS

Written Opinion issued in PCT/JP2016/065690 dated Aug. 16, 2016.
International Preliminary Report on Patentability completed by WIPO dated Dec. 14, 2017, in connection with International Patent Application No. PCT/JP2016/065690.
Office Action, issued by the Korean Intellectual Property Office dated Feb. 28, 2019, in connection with corresponding Korean Patent Application No. 10-2017-7034078.
Office Action, issued by the Korean Intellectual Property Office dated Oct. 22, 2018, in connection with corresponding Korean Patent Application No. 10-2017-7034078.
Office Action, issued by the Japanese Patent Office dated Dec. 4, 2018, in connection with corresponding Japanese Patent Application No. 2017-521894.

\* cited by examiner

ORGANIC ELECTROLUMINESCENCE DISPLAY DEVICE HAVING ENHANCED VISIBILITY OF BLACK FROM AN OBLIQUE DIRECTION

CROSS-REFERENCE TO RELATED APPLICATIONS

This application is a Continuation of PCT International Application No. PCT/JP2016/065690 filed on May 27, 2016, which was published under PCT Article 21(2) in Japanese, and which claims priority under 35 U.S.C. § 119(a) to Japanese Patent Application No. 2015-109824 filed on May 29, 2015. The above applications are hereby expressly incorporated by reference, in their entirety, into the present application.

BACKGROUND OF THE INVENTION

1. Field of the Invention

The present invention relates to an organic electroluminescence display device.

2. Description of the Related Art

In the related art, a circular polarization plate is used in an organic electroluminescence display device (organic EL display device) in order to suppress an adverse influence caused by external light reflection.

A mode in which a phase difference plate (a so-called broadband $\lambda/4$ plate) formed of a $\lambda/2$ plate and a $\lambda/4$ plate is combined with a polarizer is suitably used as the circular polarization plate (refer to JP2003-262727A).

SUMMARY OF THE INVENTION

On the other hand, in recent years, further improvement in visibility of an organic EL display device has been expected. Particularly, further improvement in visibility of black in a case where an organic EL display device is visually recognized from an oblique direction has been expected. That is, in the case where the organic EL display device is visually recognized from an oblique direction, it is expected that black does not contain other tints and appears more black.

Particularly, in many cases, various functional members such as a touch panel or a gas barrier layer are disposed in an organic EL display device, and even in such cases, the above-described improvement in visibility of black has been expected.

The present inventors have evaluated the visibility of black after bonding the circular polarization plate specifically disclosed in JP2003-262727A to an organic EL display element to which a functional member such as a touch panel or a gas barrier layer is attached on a visible side. As a result, the visibility of black is not sufficient, and further improvement is required.

The present inventors have conducted further studies on the problems, and as a result, they have found that the problems arise in a case where a layer (high refractive index layer) exhibiting a relatively high refractive index is included in the functional member.

The present invention has been made in consideration of the circumstances, and an object of the present invention is to provide an organic EL display device which has a high refractive index layer between a circular polarization plate and an organic EL display element and can achieve the improvement in visibility of black from an oblique direction.

The present inventors have conducted extensive studies on the problems of the related art, and as a result, they have found that it is possible to solve the problems by adjusting Rth of $\lambda/2$ plate and $\lambda/4$ plate in the circular polarization plate within a predetermined range.

That is, they have found that it is possible to achieve the object using the following configuration.

(1) An organic electroluminescence display device comprising, from a visible side, at least: a circular polarization plate; and an organic electroluminescence display element having a pair of electrodes and an organic light emitting layer sandwiched therebetween, in which a high refractive index layer having a refractive index of greater than 1.7 and less than 2.1 is disposed between the circular polarization plate and one of the pair of electrodes, which is positioned on the visible side, the circular polarization plate has a polarizer, a $\lambda/2$ plate, and a $\lambda/4$ plate in this order from the visible side, a retardation RthA (550) of the $\lambda/2$ plate in a thickness direction at a wavelength of 550 nm is within a range of greater than −120 nm and less than −40 nm, and a retardation RthB (550) of the $\lambda/4$ plate in a thickness direction at a wavelength of 550 nm is within a range of greater than −60 nm and less than 20 nm.

(2) The organic electroluminescence display device according to (1), in which the retardation RthA (550) is within a range of greater than −120 nm and less than or equal to −90 nm.

(3) The organic electroluminescence display device according to (1) or (2), in which the $\lambda/2$ plate and the $\lambda/4$ plate satisfy Requirement 1 or 2 described below.

Requirement 1: not to include an optically anisotropic layer formed of a polymer film Requirement 2: to include an optically anisotropic layer of which a retardation RthC (550) in a thickness direction at a wavelength of 550 nm indicates 0 to 20 nm and which is formed of a polymer film (4) The organic electroluminescence display device according to any one of (1) to (3), further comprising: a touch panel between the circular polarization plate and the organic electroluminescence display element, in which the touch panel includes the high refractive index layer.

(5) The organic electroluminescence display device according to (4), in which the high refractive index layer constitutes a transparent electrode layer of the touch panel.

(6) The organic electroluminescence display device according to any one of (1) to (3), further comprising: a gas barrier layer between the circular polarization plate and the organic electroluminescence display element, in which the gas barrier layer includes the high refractive index layer.

According to the present invention, it is possible to provide an organic EL display device which has a high refractive index layer between a circular polarization plate and an organic EL display element and can achieve the improvement in visibility of black from an oblique direction.

DESCRIPTION OF THE PREFERRED EMBODIMENTS

Figure 1:
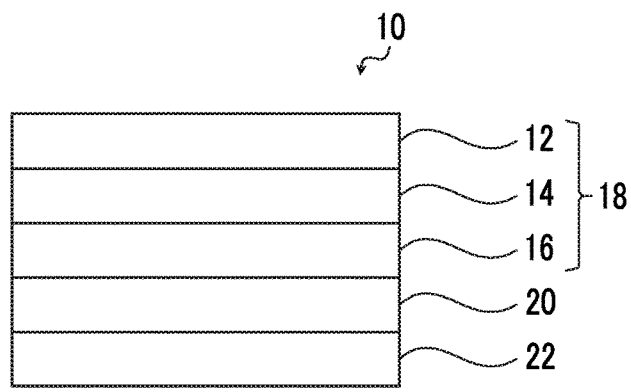
FIG. 1 is a cross-sectional view of a first embodiment of an organic EL display device of the present invention.

Hereinafter, the present invention will be described in detail. In the present specification, the numerical range represented by "to" means a range including numerical values denoted before and after "to" as a lower limit value and an upper limit value. First, terms used in the present specification will be explained.

Re ($\lambda$) and Rth ($\lambda$) respectively represent in-plane retardation at a wavelength $\lambda$ and retardation in a thickness direction. Re ($\lambda$) is measured by making light of a wavelength $\lambda$ nm incident in a film normal direction using KOBRA 21ADH or WR (manufactured by Oji Scientific Instruments). In a case of selecting a measurement wavelength $\lambda$ nm, it is possible to perform measurement by manually exchanging a wavelength selective filter or converting the measurement value using a program or the like. In a case where a film to be measured is represented by a uniaxial or biaxial index ellipsoid, Rth ($\lambda$) is calculated through the following method. This measurement method is also partially used for measuring an average tilt angle of a liquid crystal compound or an average tilt angle on the opposite side.

Rth ($\lambda$) is calculated by KOBRA 21ADH or WR based on an input film thickness value, an assumed value of an average refractive index, and a retardation value obtained by measuring 6 points of Re ($\lambda$) in total by making light of a wavelength $\lambda$ nm be incident in directions inclined in 10° steps up to 50° on a single side from the normal direction with respect to the film normal direction having an in-plane slow axis (determined using KOBRA 21ADH or WR) as an inclination axis (rotation axis) (in a case where there is no slow axis, an arbitrary direction in a film plane is set as a rotation axis). In the above description, in a case of a film having a direction in which the retardation value becomes zero at a certain inclination angle and having an in-plane slow axis from a normal direction as a rotation axis, a sign of the retardation value at a larger inclination angle than the certain inclination angle is changed to a minus sign, and then, calculation is performed using KOBRA 21ADH or WR. Rth can be calculated using Equation (A) and Equation (B) based on an input film thickness value, an assumed value of an average refractive index, and a value obtained by measuring the retardation value from two arbitrary inclination directions while having a slow axis as an inclination axis (rotation axis) (in a case where there is no slow axis, an arbitrary direction in a film plane is set as a rotation axis).

$$Re(\theta) = \left[nx - \frac{ny \times nz}{\sqrt{\left\{ny\sin\left(\sin^{-1}\left(\frac{\sin(-\theta)}{nx}\right)\right)\right\}^2 + \left\{nz\cos\left(\sin^{-1}\left(\frac{\sin(-\theta)}{nx}\right)\right)\right\}^2}}\right] \times \frac{d}{\cos\left\{\sin^{-1}\left(\frac{\sin(-\theta)}{nx}\right)\right\}}$$

Equation (A)

Re ($\theta$) represents a retardation value in a direction inclined by an angle $\theta$ from a normal direction. In addition, nx in Equation (A) represents a refractive index in a slow axis direction in the plane, ny represents a refractive index in a direction orthogonal to nx in the plane, and nz represents a refractive index in directions orthogonal to nx and ny. d represents a thickness of a film to be measured.

$$Rth = ((nx+ny)/2 - nz) \times d$$

Equation (B)

In a case where a film material to be measured is a film which cannot be expressed by a uniaxial or biaxial index ellipsoid, that is, a film in which there is no so-called optic axis, Rth ($\lambda$) is calculated through the following method. Rth ($\lambda$) is calculated by KOBRA 21ADH or WR based on an input film thickness value, an assumed value of an average refractive index, and a retardation value obtained by measuring 11 points of Re ($\lambda$) by making light of a wavelength $\lambda$ nm be incident in directions inclined in 10° steps from −50° to +50° with respect to a film normal direction having an in-plane slow axis (determined using KOBRA 21ADH or WR) as an inclination axis (rotation axis). In addition, in the above-described measurement, it is possible to use values of catalogs of various optical films in Polymer Handbook (JOHN WILEY & SONS, INC) as the assumed value of the average refractive index. It is possible to measure the average refractive index value using Abbe's refractometer in a case where the average refractive index value is not known. Main average refractive index values of the optical films are exemplified below: cellulose acylate (1.48); cycloolefin polymer (1.52); polycarbonate (1.59); polymethyl methacrylate (1.49); and polystyrene (1.59). In a case where the film thickness and the assumed values of the average refractive indexes are input, KOBRA 21ADH or WR calculates nx, ny, and nz. An Nz factor is further calculated using a relational equation of Nz=(nx−nz)/(nx−ny) using the calculated nx, ny, and nz.

In the present specification, "visible light" refers to light of a wavelength of 380 to 780 nm. In addition, in the present specification, a measurement wavelength is 550 nm unless otherwise specified.

In addition, in the present specification, an angle (for example, an angle such as "90°") and related angles (for example, "orthogonal", "parallel", "45°", and "90°") include an allowable error range in the technical fields to which the present invention belongs. This means that, for example, the errors are within a range less than or equal to ±10° of an exact angle. The error from an exact angle is preferably less than or equal to 5° and more preferably less than or equal to 3°. For example, in a case of an orthogonal angle, the errors may be within a range of 90°±10° (80° to 100°).

In the present specification, an A-plate and a C-plate are defined as follows.

There are two A-plates, a positive A-plate and a negative A-plate. In a case where a refractive index in a slow axis direction in a film plane (a direction in which an in-plane refractive index becomes maximum) is set to nx, a refractive index in a direction orthogonal to the in-plane slow axis in the plane is set to ny, and a refractive index in a thickness direction is set to nz, the positive A-plate satisfies a relationship of Equation (A1) and the negative A-plate satisfies a relationship of Equation (A2). Rth of the positive A-plate indicates a positive value and Rth of the negative A-plate indicates a negative value.

$$nx > ny \approx nz$$

Equation (A1)

$$ny < nx \approx nz$$

Equation (A2)

"≈" includes not only a case where both parties are completely the same as each other, but also a case where the two parties are substantially the same as each other. Regarding the expression "substantially the same as each other", for example, both a case where (ny−nz)×d (where d is a thickness of a film) is −10 to 10 nm (preferably −5 to 5 nm) and a case where (nx−nz)×d is −10 to 10 nm (preferably −5 to 5 nm) are included in "ny nz".

There are two C-plates, a positive C-plate and a negative C-plate. The positive C-plate satisfies a relationship of Equation (C1) and the negative C-plate satisfies a relationship of Equation (C2). Rth of the positive C-plate indicates a negative value and Rth of the negative C-plate indicates a positive value.

$$nz > nx \approx ny \quad \text{Equation (C1)}$$

$$nz < nx \approx ny \quad \text{Equation (C2)}$$

"≈" includes not only a case where both parties are completely the same as each other, but also a case where the two parties are substantially the same as each other. Regarding the expression "substantially the same as each other", for example, a case where (nx−ny)×d (where d is a thickness of a film) is 0 to 10 nm (preferably 0 to 5 nm) is included in "nx≈ny".

Examples of features of the present invention include a point that a circular polarization plate uses a λ/2 plate and a λ/4 plate exhibiting predetermined optical characteristics in an organic EL display device including a high refractive index layer, exhibiting a predetermined refractive index, between the circular polarization plate and an organic EL display element.

The details of the reason why the effect of the present invention can be obtained are unknown, but it is assumed as follows.

First, in many cases, a functional member such as a touch panel or a gas barrier film is disposed on an organic EL display element and a high refractive index layer exhibiting a predetermined refractive index is included in such a functional member. In a case where light is incident on the organic EL display device including such a high refractive index layer from an oblique direction, reflection or interference of light easily occurs on the surface of the high refractive index layer. As a result, the characteristics of light transmitted through the high refractive index layer change, and therefore, it is impossible to sufficiently improve the visibility of black from the oblique direction in the circular polarization plate of JP2003-262727A.

In the present invention, it is known that a desired effect can be obtained even in the organic EL display device including such a high refractive index layer in a case of using a λ/2 plate and a λ/4 plate exhibiting predetermined optical characteristics in consideration of the influence of the high refractive index layer.

First Embodiment

Hereinafter, a first embodiment of an organic electroluminescence display device (organic EL display device) of the present invention will be described with reference to the drawing. FIG. 1 shows a cross-sectional view of the first embodiment of the organic EL display device of the present invention. The drawings in the present invention are schematic views, and the relationship of the thickness of each layer, the positional relationship, or the like does not necessarily coincide with the actual thickness, position, or the like. The same applies to the following drawings.

An organic EL display device 10 includes a circular polarization plate 18, a touch panel 20, and an organic EL display element 22 in this order from a visible side. In FIG. 1, the upper side corresponds to the visible side. The circular polarization plate 18 includes a polarizer 12, a λ/2 plate 14, and a λ/4 plate 16 in this order from the visible side.

Hereinafter, each member included in the organic EL display device 10 will be described in detail.

<Circular Polarization Plate>

The circular polarization plate 18 includes the polarizer 12, the λ/2 plate 14, and the λ/4 plate 16 in this order. Hereinafter, these will be described in detail.

(Polarizer)

The polarizer 12 may be a member (linear polarizer) having a function of converting light into specific linear polarization, and it is possible to mainly use an absorption type polarizer and a reflective polarizer.

An iodine type polarizer, a dye type polarizer using a dichroic dye, a polyene type polarizer, and the like are used as the absorption type polarizer. There are coating type polarizer and a stretching type polarizer in the iodine type polarizer and the dye type polarizer. Although both can be applied, a polarizer which is stretched and produced by adsorbing iodine or a dichroic dye on polyvinyl alcohol is preferable.

In addition, examples of a method for obtaining a polarizer by stretching and dyeing a laminated film obtained by disposing a polyvinyl alcohol layer on a base material include JP5048120B, JP5143918B, JP4691205B, JP4751481B, and JP4751486B, and it is also possible to preferably use well-known techniques relating the polarizer.

A polarizer in which different kinds of birefringence thin films are laminated, a wire grid type polarizer, a polarizer in which a ¼ wavelength plate is combined with a cholesteric liquid crystal having a selective reflection region, or the like is used as the reflective polarizer.

Among them, a polarizer containing a polyvinyl alcohol resin (preferably a polymer containing —$CH_2$—CHOH— as a repeating unit, particularly at least one selected from the group consisting of polyvinyl alcohol and an ethylene-vinyl alcohol copolymer) is preferable from the viewpoint of handling properties.

The thickness of the polarizer 12 is not particularly limited, but is preferably less than or equal to 35 μn, more preferably 3 to 25 μm, and still more preferably 4 to 20 μm from the viewpoints of excellent handling properties and optical characteristics. In the case of the thickness, it is possible to make a display device thinner.

(λ/2 Plate)

The λ/2 plate 14 is an optically anisotropic layer in which an in-plane retardation Re (λ) at a specific wavelength of λ nm satisfies Re (λ) λ/2. This equation may be attained at any wavelength (for example, 550 nm) in a visible light region. Among them, it is preferable that the in-plane retardation Re (550) at a wavelength of 550 nm satisfies the following relationship.

$$210 \text{ nm} \leq Re(550) \leq 300 \text{ nm}$$

Among them, it is more preferable that the in-plane retardation Re (550) at a wavelength of 550 nm satisfies 220 nm≤Re (550)≤290 nm.

The angle formed by a slow axis of the λ/2 plate 14 and an absorption axis of the polarizer 12 is preferably within a range of 75±10°, more preferably within a range of 75±8°, and still more preferably within a range of 75±5°.

In other words, the angle formed by the slow axis of the λ/2 plate 14 and a transmission axis of the polarizer 12 is preferably within a range of 15±10°, more preferably within a range of 15±8°, and still more preferably within a range of 15±5°.

The above-described angles are intended to be angles formed by a slow axis of a λ/2 plate and an absorption axis (or a transmission axis) of a polarizer in a case of being visually recognized from the normal direction of the surface of the polarizer.

RthA (550) which is a retardation value in a thickness direction of the λ/2 plate 14 and is measured at a wavelength of 550 nm is within a range of greater than −120 nm and less than −40 nm, and preferably within a range of greater than −120 nm and less than or equal to −90 nm from the viewpoint of more excellent visibility of black from an oblique direction (hereinafter, also simply called a "viewpoint of more excellent effect of the present invention").

In a case where RthA (550) is less than or equal to −120 nm and a case where RthA (550) is greater than or equal to −40 nm, the effect of the present invention is deteriorated.

The thickness of the λ/2 plate 14 is not particularly limited, but in many cases, the thickness thereof is about 0.5 to 200 μm, and is preferably 0.5 to 50 μm, more preferably 0.5 to 10 μm, and still more preferably 0.5 to 5 μm from the viewpoint of thinning.

The above-described thickness is intended to be an average thickness, and is obtained by measuring arbitrary 5 points of the thicknesses of the λ/2 plate 14 and arithmetically averaging the measured thicknesses.

The material forming the λ/2 plate 14 is not particularly limited, but a liquid crystal compound is preferably contained in the λ/2 plate 14 from the viewpoint of thinning That is, the λ/2 plate 14 is preferably a layer containing a liquid crystal compound. However, the λ/2 plate 14 may be formed of other materials as long as the materials satisfy predetermined characteristics such as the retardation value in a thickness direction. For example, the λ/2 plate 14 may be formed of a polymer film (a film formed of a polymer (resin), particularly, a polymer film subjected to stretching treatment).

More specific examples of the λ/2 plate 14 include an optically anisotropic layer obtained by forming a low molecular liquid crystal compound in a nematic alignment in a liquid crystal state, and then immobilizing the alignment through photocrosslinking or thermal crosslinking, and an optically anisotropic layer obtained by forming a high molecular liquid crystal compound in a nematic alignment in a liquid crystal state, and then immobilizing the alignment through cooling. In the present invention, the λ/2 plate 14 is a layer formed by immobilizing a liquid crystal compound, for example, through polymerization or the like, and it is unnecessary for the λ/2 plate to exhibit liquid crystallinity anymore after the liquid crystal compound becomes a layer.

In general, the liquid crystal compound can be classified into a rod type (rod-like liquid crystal compound) and a disk type (a discotic liquid crystal compound or a disk-like liquid crystal compound) from its shape. Furthermore, there is a low molecular type and a high molecular type. The high molecule generally indicates a molecule having a degree of polymerization of greater than or equal to 100 (Polymer physics-Phase Transition Dynamics, Masao Doi, p. 2, Iwanami Shoten, 1992). In the present invention, any liquid crystal compound can be used, but a discotic liquid crystal compound is preferable from the viewpoint of more excellent effect of the present invention. Two or more rod-like liquid crystal compounds, two or more discotic liquid crystal compounds, or a mixture of a rod-like liquid crystal compound and a discotic liquid crystal compound may be used.

It is possible to use, for example, a rod-like liquid crystal compound disclosed in claim 1 of JP1999-513019A (JP-H11-513019A) or a rod-like liquid crystal compound disclosed in paragraphs [0026] to [0098] in JP2005-289980A as the rod-like liquid crystal compound. It is possible to use, for example, a disk-like liquid crystal compound disclosed in paragraphs [0020] to [0067] of JP2007-108732A or a disk-like liquid crystal compound disclosed in paragraphs [0013] to [0108] of JP2010-244038A. However, the present invention is not limited thereto.

It is more preferable to form the λ/2 plate 14 using a liquid crystal compound (a rod-like liquid crystal compound or a disk-like liquid crystal compound) having a polymerizable group since it is possible to reduce the temperature change or the humidity change of optical characteristics. A mixture of two or more liquid crystal compounds may be used, and in this case, at least one liquid crystal compound preferably has two or more polymerizable group.

That is, the λ/2 plate 14 is preferably a layer formed by immobilizing a rod-like liquid crystal compound having a polymerizable group or a disk-like liquid crystal compound having a polymerizable group through polymerization. In this case, it is unnecessary for the λ/2 plate to exhibit liquid crystallinity anymore after the liquid crystal compound becomes a layer.

The types of the polymerizable groups contained in a rod-like liquid crystal compound or a disk-like liquid crystal compound are not particularly limited, and a functional group enabling an addition polymerization reaction is preferable, and a polymerizable, ethylenically unsaturated group or a cyclic polymerizable group is more preferable. More specifically, preferred examples thereof include a (meth) acryloyl group, a vinyl group, a styryl group, and an allyl group, and a (meth)acryloyl group is more preferable. The (meth)acryloyl group is a concept including both a methacryloyl group and an acryloyl group.

The method for forming the λ/2 plate 14 is not particularly limited, and examples thereof include well-known methods.

The λ/2 plate 14 can be manufactured by coating a predetermined substrate (including a substrate) with a composition for forming an optically anisotropic layer containing a liquid crystal compound having a polymerizable group (hereinafter, also simply referred to a "composition") to form a coated film, and subjecting the obtained coated film to a curing treatment (irradiation with ultraviolet light (light irradiation treatment) or heating treatment). An alignment layer to be described below may be used as necessary.

The coating using the above-described composition can be performed through a well-known method (for example, a wire bar-coating method, an extrusion coating method, a direct gravure coating method, a reverse gravure coating method, or a die-coating method).

Components other than the above-described liquid crystal compounds may be contained in the above-described composition.

For example, a polymerization initiator may be contained in the composition. The polymerization initiator to be used can be selected according to the type of polymerization reaction, and examples of thereof include a thermal polymerization initiator and a photopolymerization initiator. Examples of the photopolymerization initiator include a α-carbonyl compound, acyloin ether, a α-hydrocarbon-substituted aromatic acyloin compound, a polynuclear quinone compound, and a combination of triarylimidazole dimer and p-aminophenyl ketone.

The amount of the photopolymerization initiator used is, with respect to the total solid content of the composition, preferably 0.01 to 20 mass % and more preferably 0.5 to 5 mass %.

In addition, the composition may contain a polymerizable monomer from the viewpoints of evenness of a coating film and the strength of the film.

Examples of the polymerizable monomer include a radically polymerizable or cationically polymerizable compound. A polyfunctional radically polymerizable monomer is preferable, and a liquid crystal compound containing the above-described polymerizable group and a copolymerizable monomer are more preferable. Examples thereof include monomers disclosed in paragraphs [0018] to [0020] in JP2002-296423A.

The amount of polymerizable monomer added is, with respect to the total mass of the liquid crystal compound, preferably 1 to 50 mass %, and more preferably 2 to 30 mass %.

In addition, a surfactant may be contained in the composition from the viewpoints of evenness of a coating film and the strength of the film.

Examples of the surfactant include well-known compounds in the related art, and a fluorine compound is particularly preferable. Specific examples thereof include compounds disclosed in paragraphs [0028] to [0056] in JP2001-330725A and compounds disclosed in paragraphs [0069] to [0126] in JP2003-295212.

In addition, the composition may contain a solvent, and an organic solvent is preferably used. Examples of the organic solvent include amides (for example, N,N-dimethylformamide), sulfoxides (for example, dimethylsulfoxide), heterocyclic compounds (for example, pyridine), hydrocarbons (for example, benzene and hexane), alkyl halides (for example, chloroform and dichloromethane), esters (for example, methyl acetate, ethyl acetate, butyl acetate), ketones (for example, acetone, methyl ethyl ketone), ethers (for example, tetrahydrofuran and 1,2-dimethoxyethane). Alkyl halide and ketone are preferable. Two or more organic solvents may be used in combination.

In addition, the composition may contain various alignment agents such as vertical alignment promoters such as a vertical alignment agent on a polarizer interface side and a vertical alignment agent on an air interface side, and horizontal alignment promoters such as a horizontal alignment agent on a polarizer interface side and a horizontal alignment agent on an air interface side.

Furthermore, the composition may contain an adhesion improver, a plasticizer, or a polymer in addition to the above-described components.

(λ/4 Plate)

The λ/4 plate 16 (a plate having a λ/4 function) is a plate having a function of converting linear polarization at a specific wavelength into circular polarization (or converting circular polarization into linear polarization). More specifically, the λ/4 plate is a plate in which the in-plane retardation value at a predetermined wavelength λ nm indicates Re (λ)≈λ/4 (or an odd multiple thereof). This equation may be attained at any wavelength (for example, 550 nm) in a visible light region. However, it is preferable that the in-plane retardation Re (550) at a wavelength of 550 nm satisfies the following relationship.

$$100 \text{ nm} \leq Re(550) \leq 160 \text{ nm}$$

Among them, it is more preferable that the in-plane retardation Re (550) at a wavelength of 550 nm satisfies 110 nm Re (550) 150 nm.

The angle θ formed by a slow axis of the λ/4 plate 16 and a slow axis of the λ/2 plate 14 is preferably within a range of 60±10°, more preferably within a range of 60±8°, and still more preferably within a range of 60±5°.

The above-described angle is intended to be an angle formed by a slow axis of the λ/4 plate 16 and a slow axis of the λ/2 plate 14 in a case of being visually recognized from the normal direction of the surface of the polarizer 12.

The angle formed by the slow axis of the λ/4 plate 16 and an absorption axis of the polarizer 12 is preferably within a range of 15°±8°, more preferably within a range of 15°±6°, and still more preferably within a range of 15°±3°.

In other words, the angle formed by the slow axis of the λ/4 plate 16 and a transmission axis of the polarizer 12 is preferably within a range of 75±10°, more preferably within a range of 75±8°, and still more preferably within a range of 75±5°.

The above-described angles are intended to be angles formed by an absorption axis (or a transmission axis) of the polarizer 12 and an in-plane slow axis of the λ/4 plate 16 in a case of being visually recognized from the normal direction of the surface of the polarizer 12.

RthB (550) which is a retardation value in a thickness direction of the λ/4 plate 16 and is measured at a wavelength of 550 nm is within a range of greater than −60 nm and less than 20 nm, and preferably within a range of greater than −60 nm and less than or equal to 15 nm from the viewpoint of more excellent effect of the present invention.

In a case where RthB (550) is less than or equal to −60 nm and a case where RthB (550) is greater than or equal to 20 nm, the effect of the present invention is deteriorated.

The thickness of the λ/4 plate 16 is not particularly limited, but in many cases, the thickness thereof is about 0.5 to 200 μm, and is preferably 0.5 to 50 μm, more preferably 0.5 to 10 μm, and still more preferably 0.5 to 5 μm from the viewpoint of thinning.

The above-described thickness is intended to be an average thickness, and is obtained by measuring arbitrary 5 points of the thicknesses of the λ/4 plate 16 and arithmetically averaging the measured thicknesses.

The material forming the λ/4 plate 16 is not particularly limited, but a liquid crystal compound is preferably contained in the λ/4 plate 16 from the viewpoint of thinning That is, the λ/4 plate 16 is preferably a layer containing a liquid crystal compound. The definition of the liquid crystal compound is as described above. Among them, the λ/4 plate 16 is preferably a layer formed by immobilizing a liquid crystal compound (a rod-like liquid crystal compound or a disk-like liquid crystal compound) having a polymerizable group through polymerization or the like, and in this case, it is unnecessary for the λ/4 plate to exhibit liquid crystallinity anymore after the liquid crystal compound becomes a layer.

In FIG. 1, both the λ/2 plate 14 and the λ/4 plate 16 have a single layer structure. However, the present invention is not limited to this embodiment, and the λ/2 plate 14 and the λ/4 plate 16 each may independently have a multilayer structure. That is, λ/2 plate 14 and the λ/4 plate 16 each may have a structure including a plurality of layers in a case where the above-described RthA (550) and RthB (550) are within a predetermined range. In a case where a plurality of layers are included in a λ/2 plate, the retardation of the entire λ/2 plate including all of the layers forming the λ/2 plate in a thickness direction at a wavelength of 550 nm is within the above-described range (greater than −120 nm and less than or equal to −40 nm). In addition, in a case where a plurality of layers are included in a λ/4 plate, the retardation of the entire λ/4 plate including all of the layers forming the λ/4 plate in a thickness direction at a wavelength of 550 nm is within the above-described range (greater than −60 nm and less than or equal to 20 nm).

Figure 2:
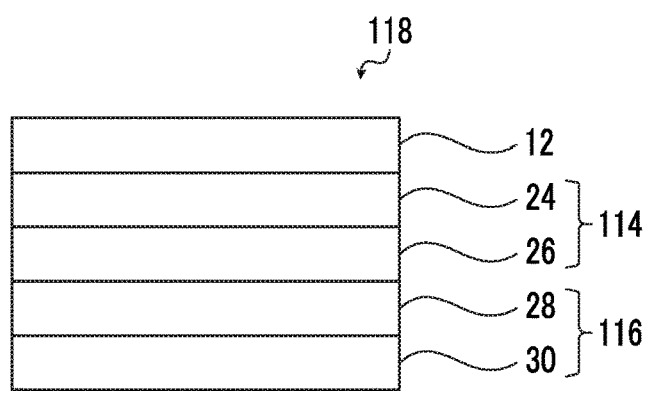
FIG. 2 is a cross-sectional view of another embodiment of a circular polarization plate of the present invention.

For example, as shown in FIG. 2, a circular polarization plate 118 includes the polarizer 12, a λ/2 plate 114, and a λ/4 plate 116, the λ/2 plate 114 includes two layers, a first optically anisotropic layer 24 and a second optically anisotropic layer 26, and the λ/4 plate 116 includes two layers, a third optically anisotropic layer 28 and a fourth optically anisotropic layer 30. In this case, the retardation of the entire λ/2 plate 114 in the thickness direction at a wavelength of 550 nm is within the above-described range (greater than −120 nm and less than or equal to −40 nm) and the retardation of the entire λ/4 plate 116 in the thickness direction at a wavelength of 550 nm is within the above-described range (greater than −60 nm and less than or equal to 20 nm). The type of optically anisotropic layer constituting the first optically anisotropic layer 24 to the fourth optically anisotropic layer 30 is not particularly limited, and the retardation of the λ/2 plate and the λ/4 plate in the thickness direction at a wavelength of 550 nm may be within a predetermined range. However, for example, the first optically anisotropic layer 24 and the third optically anisotropic layer 28 are preferably so-called C-plates, and the second optically anisotropic layer 26 and the fourth optically anisotropic layer 30 are preferably so-called A-plates, from the viewpoint of easy adjustment of the retardation.

In addition, the retardation of the first optically anisotropic layer 24 in the thickness direction at a wavelength of 550 nm is not particularly limited. However, in many cases, the retardation thereof is −180 to 100 nm, and in much more cases, the retardation thereof is 0 to 100 nm.

In addition, the retardation of the second optically anisotropic layer 26 in the thickness direction at a wavelength of 550 nm is not particularly limited. However, in many cases, the retardation thereof is −150 to 140 nm, and in much more cases, the retardation thereof is −150 to 0 nm.

In addition, the retardation of the third optically anisotropic layer 28 in the thickness direction at a wavelength of 550 nm is not particularly limited. However, in many cases, the retardation thereof is −70 to 100 nm, and in much more cases, the retardation thereof is 0 to 100 nm.

In addition, the retardation of the fourth optically anisotropic layer 30 in the thickness direction at a wavelength of 550 nm is not particularly limited. However, in many cases, the retardation thereof is −80 to 70 nm, and in much more cases, the retardation thereof is −80 to 0 nm.

In FIG. 2, the embodiment in which both the λ/2 plate and the λ/4 plate have a two-layer structure has been described. However, the present invention is not limited to the embodiment, and may be an embodiment in which the λ/2 plate is a single layer structure and the λ/4 plate is a multilayer structure, or may be an embodiment in which the λ/2 plate is a multilayer structure and the λ/4 plate is a single layer structure.

In addition, in the case of the multilayer structure, the number of layers may be greater than or equal to 3.

Furthermore, as will be described in detail below, an alignment film, a pressure sensitive adhesive layer, or the like may be included in the λ/2 plate and the λ/4 plate in a case where RthA (550) and RthB (550) are within the above-described ranges.

From the viewpoint of thinning of the circular polarization plate (and organic EL display device), at least one of the λ/2 plate and the λ/4 plate preferably satisfies Requirement 1 or 2 described below and both the λ/2 plate and the λ/4 plate more preferably satisfy Requirement 1 or 2.

Requirement 1: not to include an optically anisotropic layer formed of a polymer film Requirement 2: to include an optically anisotropic layer of which a retardation RthC (550) in a thickness direction at a wavelength of 550 nm indicates 0 to 20 nm and which is formed of a polymer film In general, an optically anisotropic layer formed of a polymer film tends to have a thick thickness in order to exhibit large Rth. For this reason, at least one (preferably both) of the λ/2 plate and the λ/4 plate does not include an optically anisotropic layer formed of a polymer film. Alternately, even if at least one (preferably both) of the λ/2 plate and the λ/4 plate includes an optically anisotropic layer formed of a polymer film, retardation RthC (550) of the optically anisotropic layer formed of a polymer film in a thickness direction at a wavelength of 550 nm preferably shows 0 to 20 nm.

The optically anisotropic layer formed of a polymer film is an optically anisotropic layer of which the main component is formed of a polymer (resin), and does not substantially contain a liquid crystal compound.

(Other Layers)

The circular polarization plate 18 may include layers other than the polarizer 12, the λ/2 plate 14, and the λ/4 plate 16 as long as the effect of the present invention is not impaired. Hereinafter, an example will be shown.

(Alignment Layer)

An alignment film having a function of defining the alignment direction of a liquid crystal compound may be included in the circular polarization plate 18 (particularly, in the λ/2 plate and the λ/4 plate).

In general, the main component of the alignment film is a polymer. The material of a polymer for an alignment film is disclosed in many kinds of literature, and a large number of commercially available products are available. The material of a polymer to be used is preferably polyvinyl alcohol or polyimide, and derivatives thereof. Modified or unmodified polyvinyl alcohol is particularly preferable. Regarding the alignment film that can be used in the present invention, it is possible to refer to modified polyvinyl alcohol disclosed in page 43, line 24 to page 49, line 8 of WO01/88574A1 and in paragraphs [0071] to [0095] of JP3907735B. The alignment film is usually subjected to a well-known rubbing treatment. That is, it is preferable that the alignment film is usually a rubbing alignment film which is subjected to rubbing treatment.

(Polarizer Protective Film)

A polarizer protective film may be disposed on the surface of a polarizer. The polarizer protective film may be disposed on only a single surface of the polarizer (on the surface on a visible side), or may be disposed on both surfaces of the polarizer.

The configuration of the polarizer protective film is not particularly limited, and may be, for example, a so-called transparent support or a hard coat layer, or may be a laminate of a transparent support and a hard coat layer.

Any well-known layer can be used as the hard coat layer. For example, a layer obtained by polymerizing and curing the above-described polyfunctional monomer may be used as the hard coat layer.

In addition, any well-known transparent support can be used as the transparent support. For example, a cellulose polymer typified by triacetyl cellulose (hereinafter, referred to as cellulose acylate), a thermoplastic norbornene resin (ZEONEX and ZEONOR manufactured by ZEON CORPORATION, ARTON manufactured by JSR Corporation, and the like), an acrylic resin, and a polyester resin can be used as the material forming the transparent support.

The thickness of the polarizer protective film is not particularly limited, but is preferably less than or equal to 40 µm and more preferably less than or equal to 25 µm for the reason that it is possible to reduce the thickness of a polarizing plate.

In addition, a pressure sensitive adhesive layer or an adhesion layer may be disposed between layers in order to ensure the adhesion between the layers.

<Touch Panel>

The touch panel 20 is a functional member disposed between the circular polarization plate 18 described above and an organic EL display element 22 to be described below, and is a sensor that detects a contact position in a case where an external conductor such as a finger of an operator comes into contact with (approaches) the surface of the organic EL display device on a visible side from the visible side.

Figure 3:
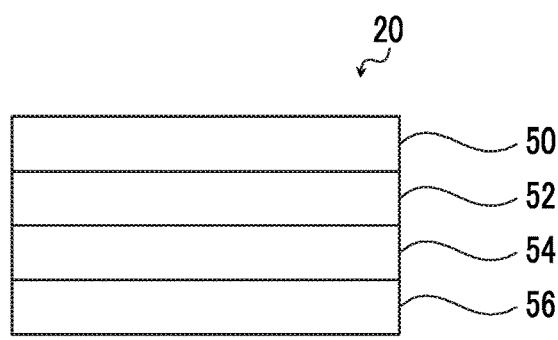
FIG. 3 is a cross-sectional view of an embodiment of a touch panel.

As the configuration of the touch panel 20, a first insulating layer 50, a transparent electrode layer (conductive layer) 52 including a sensor electrode, a second insulating layer 54, and a substrate 56 are included in the touch panel from a visible side as shown in FIG. 3. The transparent electrode layer 52 corresponds to a high refractive index layer having a refractive index of greater than 1.7 and less than 2.1. As the configuration of the touch panel 20, the present invention is not limited to the embodiment of FIG. 3 as long as the touch panel includes the high refractive index layer, and can have any well-known configuration.

The type of touch panel is not particularly limited, and may be appropriately selected according to the purpose. Examples of the touch panel include a surface type capacitance type touch panel, a projection type capacitance type touch panel, and a resistance film type touch panel.

Hereinafter, each member constituting the touch panel 20 will be described in detail.

(First Insulating Layer and Second Insulating Layer)

The material forming the first insulating layer 50 and the second insulating layer 54 is not particularly limited, but the first insulating layer and the second insulating layer can be formed of an inorganic material, an organic material, or a mixture of an inorganic material and an organic material. Examples of the inorganic material include inorganic materials such as NaF (1.3), Na$_3$AlF$_6$ (1.35), LiF (1.36), MgF$_2$ (1.38), CaF$_2$ (1.4), BaF$_2$ (1.3), SiO$_2$ (1.46), LaF$_3$ (1.55), CeF$_3$ (1.63), and Al$_2$O$_3$ (1.63) [each numerical value in parentheses of the materials is a refractive index of light]. Among them, SiO$_2$, MgF$_2$, Al$_2$O$_3$, and the like are preferably used. In addition, examples of the organic materials include an acrylic resin, a urethane resin, a melamine resin, an alkyd resin, a siloxane polymer, and an organosilane condensate.

Two kinds of insulating layers, the first insulating layer 50 and the second insulating layer 54, are disposed in the touch panel 20, but may not be included in the touch panel as long as the touch panel is operated.

(Transparent Electrode Layer)

The transparent electrode layer 52 constitutes a sensing portion and includes a first detection electrode and a second detection electrode which have a pattern shape. The position of a fingertip is computed using an integrated circuit (IC) based on the capacitance change amount between the detection electrodes with which a finger comes into contact or which a finger approaches, by detecting the change amount.

The first detection electrode is an electrode which extends in a first direction (X-direction) and is arranged in a second direction (Y-direction) orthogonal to the first direction, and has a predetermined pattern. The second detection electrode is an electrode which extends in the second direction (Y-direction) and is arranged in the first direction (X-direction), and has a predetermined pattern. The first detection electrode and the second detection electrode intersect with each other via an insulating layer.

The transparent electrode layer 52 is a high refractive index layer having a refractive index of greater than 1.7 and less than 2.1. The refractive index is preferably 1.75 to 2.05 and more preferably 1.8 to 2.0 from the viewpoint of more excellent effect of the present invention.

The refractive index is measured through a light interference method using a reflection spectral film thickness meter FE3000 (manufactured by OTSUKA ELECTRONICS Co., LTD). The measurement wavelength of the refractive index is 550 nm.

The material forming the transparent electrode layer 52 may be a material exhibiting the refractive index. For example, metal oxides such as indium tin oxide (ITO), zinc oxide, antimony-added tin oxide, fluorine-added tin oxide, aluminum-added zinc oxide, potassium-added zinc oxide, and silicon-added zinc oxide. Two or more these metal oxides may be combined.

(Substrate)

The substrate 56 is a member for supporting each of the members described above.

A so-called transparent substrate (particularly, transparent insulating substrate) is preferable as the substrate 56. Specific examples thereof include a resin substrate, a ceramic substrate, and a glass substrate. Among them, a resin substrate is preferable for the reason of excellent toughness.

More specific examples of the material forming the resin substrate include a polyethersulfone resin, a polyacrylic resin, a polyurethane resin, a polyester resin, a polycarbonate resin, a polysulfone resin, a polyamide resin, a polyacrylate resin, a polyolefin resin, a cellulose resin, a polyvinyl chloride resin, and a cycloolefin resin.

The configuration of the touch panel is not limited to the embodiment of FIG. 3 described above. For example, a plurality of transparent electrode layers may be included in the touch panel. For example, the touch panel may include: a first transparent electrode layer including a first detection electrode as an electrode which extends in a first direction (X-direction) and is arranged in a second direction (Y-direction) orthogonal to the first direction; and a second transparent electrode layer including a second detection electrode as an electrode which extends in the second direction (Y-direction) and is arranged in the first direction (X-direction) orthogonal to the second direction, in which the first transparent electrode layer and the second transparent electrode layer may be disposed via an insulating layer. In this case, at least one of the first transparent electrode layer and the second transparent electrode layer may correspond to the above-described high refractive index layer.

In addition, members (for example, a pressure sensitive adhesive layer) other than the insulating layer, the transparent electrode layers, and the substrate described above may be included in the touch panel.

<Organic EL Display Element>

Figure 4:
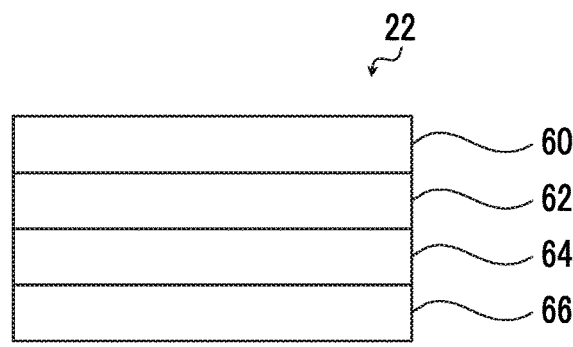
FIG. 4 is a cross-sectional view of an embodiment of an organic EL display element.

As shown in FIG. 4, the organic EL display element 22 includes a first electrode 60 functioning as a cathode, an organic light emitting layer 62, a second electrode 64 functioning as an anode, and a substrate 66 in this order from the visible side. That is, the organic light emitting layer 62 is sandwiched between the first electrode 60 and the second electrode 64. In many cases, external light incident on the organic EL display device 10 is transmitted through the first electrode and is reflected on the surface of the second electrode.

Hereinafter, each member constituting the organic EL display element 22 will be described in detail.

(First Electrode)

The first electrode 60 is a cathode and plays a role of injecting electrons into the organic light emitting layer 62.

As the material forming the first electrode 60, a material that can form a transparent or translucent electrode is preferable, and metal having a low work function is preferable in order to perform efficient electron injection. For example, appropriate metals such as tin, magnesium, indium, calcium, aluminum, and silver or an alloy thereof can be used. Specific examples thereof include a low work function alloy electrode such as a magnesium-silver alloy, a magnesium-indium alloy, and an aluminum-lithium alloy.

(Organic Light Emitting Layer)

The organic light emitting layer 62 is a layer sandwiched between the first electrode 60 and the second electrode 64, and is a layer that emits light by recombining electrons injected from the first electrode 60 with holes injected from the second electrode 64.

Any well-known materials can be used as the material forming the organic light emitting layer 62. Examples thereof include low molecular materials such as a 9,10-diarylanthracene derivative, pyrene, coronene, perylene, rubrene, 1,1,4,4-tetraphenylbutadiene, a tris(8-quinolinolato) aluminum complex, a tris(4-methyl-8-quinolinolato) aluminum complex, a bis(8-quinolinolato) zinc complex, and tris(4-methyl-5-trifluoromethyl-8-quinolinolato) aluminum complex; and high molecular materials such as polyfluorene, polyparaphenylene vinylene, and polythiophene.

(Second Electrode)

The second electrode 64 is an anode and plays a role of injecting holes into the organic light emitting layer 62. The second electrode 64 is usually formed of conductive polymers such as poly(3-methylthiophene), polypyrrole, and polyaniline, in addition to metals such as aluminum, gold, silver, nickel, palladium, and platinum, metal oxides such as indium and/or tin, metal halides such as copper iodide, and carbon black.

(Substrate)

The substrate 66 is a support that supports each member described above, and the type of substrate is not particularly limited. Examples thereof include a resin substrate, a ceramic substrate, and a glass substrate. Examples of the type of resin forming the resin substrate include a resin forming the resin substrate described in the above-described touch panel.

The configuration of the organic EL display element is not limited to the configuration of FIG. 4, and other members (for example, a hole transporting layer, a hole injecting layer, an interlayer, an electron blocking layer, an electron transporting layer, an electron injecting layer, a hole blocking layer) may be further included in the organic EL display element.

The organic EL display device 10 includes at least the circular polarization plate 18, the touch panel 20, and the organic EL display element 22 described above, but may include other members.

For example, a sealing agent layer, a pressure sensitive adhesive layer, or an adhesion layer may be disposed between the circular polarization plate 18 and the touch panel 20 or between the touch panel 20 and the organic EL display element 22.

Second Embodiment

Figure 5:
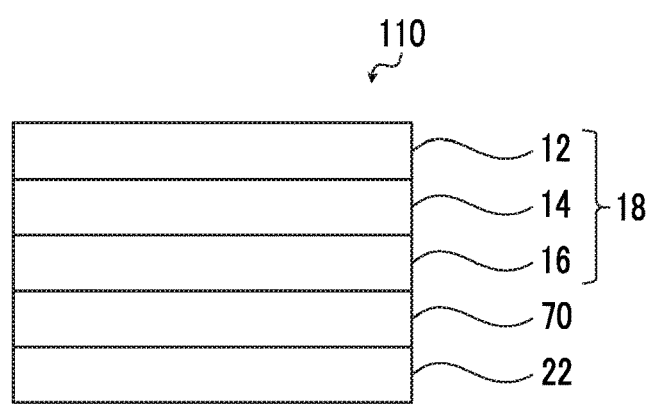
FIG. 5 is a cross-sectional view of a second embodiment of an organic EL display device of the present invention.

Hereinafter, a second embodiment of an organic EL display device of the present invention will be described with reference to the drawing. FIG. 5 shows a cross-sectional view of the second embodiment of the organic EL display device of the present invention.

An organic EL display device 110 includes a circular polarization plate 18, a gas barrier layer 70, and an organic EL display element 22 in this order from a visible side. In FIG. 5, the upper side corresponds to the visible side. The circular polarization plate 18 includes a polarizer 12, a $\lambda/2$ plate 14, and a $\lambda/4$ plate 16 in this order.

The organic EL display device 110 shown in FIG. 5 has the same layers as those in the organic EL display device 10 shown in FIG. 1 except that the gas barrier layer 70 is included in the organic EL display device 110 instead of the touch panel 20. Therefore, the same components will be denoted by the same reference numerals, and the description thereof will not be repeated. Hereinafter, the configuration of the gas barrier layer 70 will be described in detail.

(Gas Barrier Layer)

The gas barrier layer 70 is a functional member disposed between the circular polarization plate 18 and the organic EL display element 22, and is a layer that suppresses intrusion of moisture or the like into the organic EL display element 22.

Figure 6:
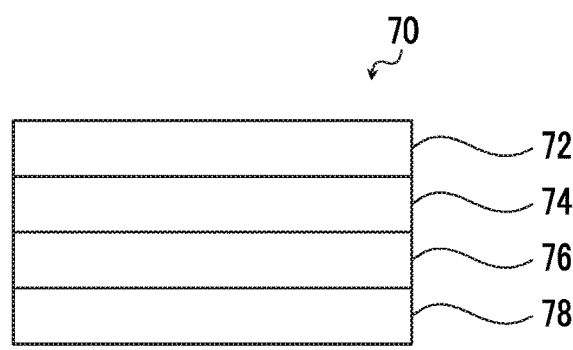
FIG. 6 is a cross-sectional view of an embodiment of a gas barrier layer.

The gas barrier layer 70 is configured to include a first inorganic film 72, a first organic film 74, a second inorganic film 76, and a second organic film 78 in this order from a visible side as shown in FIG. 6. The first inorganic film 72 and the second inorganic film 76 correspond to a high refractive index layer having a refractive index of greater than 1.7 and less than 2.1.

The refractive index of the first inorganic film 72 and the refractive index of the second inorganic film 76 each are greater than 1.7 and less than 2.1. The refractive index is preferably 1.75 to 2.05 and more preferably 1.8 to 2.0 from the viewpoint of more excellent effect of the present invention.

The refractive index is measured through a light interference method using a reflection spectral film thickness meter FE3000 (manufactured by OTSUKA ELECTRONICS Co., LTD). The measurement wavelength of the refractive index is 550 nm.

The materials forming the first inorganic film 72 and the second inorganic film 76 are not particularly limited as long as the materials exhibit the above-described refractive index. However, suitable examples of the films include films formed of inorganic compounds such as: metal oxides such as aluminum oxide, magnesium oxide, zirconium oxide, titanium oxide, and indium tin oxide (ITO); metal nitrides such as aluminum nitride; metal carbides; silicon oxides such as silicon oxynitride, silicon oxycarbide, and silicon oxynitrocarbide; silicon nitride such as silicon nitride and silicon nitride carbide; silicon carbide such as silicon carbide; hydrides thereof; mixtures of two or more thereof; and hydrogen-containing substances thereof.

The materials forming the first organic film 74 and the second organic film 78 are not particularly limited, and various organic compounds (resin/polymer compounds) can be applied. Examples of the materials thereof include a polyester resin, a (meth)acrylic resin, a polystyrene resin, a transparent fluororesin, a polyimide resin, a fluorinated polyimide resin, a polyamide resin, a polyamideimide resin, a polyetherimide resin, a cellulose acylate resin, a polyurethane resin, a polyether ether ketone resin, a polycarbonate resin, an alicyclic polyolefin resin, a polyacrylate resin, a polyethersulfone resin, and a polysulfone resin.

The configuration of the gas barrier layer is not limited to the embodiment of FIG. 6 as long as a high refractive index layer indicating a predetermined refractive index is included therein. For example, the gas barrier layer may have at least one combination of an inorganic film and an organic film, and at least one layer of the inorganic film may be the above-described high refractive index layer.

The embodiments including a touch panel or a gas barrier layer have been described as embodiments in which an organic EL display device includes a high refractive index layer in the above description. However, the present invention is not limited thereto embodiments.

EXAMPLES

Hereinafter, the present invention will be more specifically described with reference to Examples. The material, the usage, the proportion, treatment contents, a treatment procedure, and the like shown in Examples below can be appropriately changed without departing from the gist of the present invention. Accordingly, the range in the present invention is not limited to specific examples shown below.

Example 1

(1) Production of Optically Anisotropic Layer A (Preparation of Cellulose Ester Solution A-1)

A cellulose ester solution A-1 was prepared by putting the following composition into a mixing tank, and stirring the composition while heating the composition to dissolve each component.

Composition of Cellulose Ester Solution A-1

| | |
|---|---|
| Cellulose acetate (degree of acetylation: 2.86) | 100 parts by mass |
| Methylene chloride (first solvent) | 320 parts by mass |
| Methanol (second solvent) | 83 parts by mass |
| 1-Butanol (third solvent) | 3 parts by mass |
| Triphenyl phosphate | 7.6 parts by mass |
| Biphenyl diphenyl phosphate | 3.8 parts by mass |

(Preparation of Matte Agent Dispersion B-1)

A matte agent dispersion B-1 was prepared by putting the following composition into a dispersing machine, and stirring the composition to dissolve each component.

Composition of Matte Agent Dispersion B-1

| | |
|---|---|
| Silica particle dispersion (average particle diameter: 16 nm) "AEROSIL R972" manufactured by NIPPON AEROSIL CO., LTD | 10.0 parts by mass |
| Methylene chloride | 72.8 parts by mass |
| Methanol | 3.9 parts by mass |
| Butanol | 0.5 parts by mass |
| Cellulose ester solution A-1 | 10.3 parts by mass |

(Preparation of ultraviolet absorber solution C-1)

An ultraviolet absorber solution C-1 was prepared by putting the following composition into another mixing tank, and stirring the composition while heating the composition to dissolve each component.

Composition of Ultraviolet Absorber Solution C-1

| | |
|---|---|
| Ultraviolet absorbing agent (following UV-1) | 10.0 parts by mass |
| Ultraviolet absorbing agent (following UV-2) | 10.0 parts by mass |
| Methylene chloride | 55.7 parts by mass |
| Methanol | 10 parts by mass |
| Butanol | 1.3 parts by mass |
| Cellulose ester solution A-1 | 12.9 parts by mass |

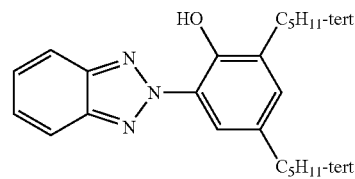

(UV-1)

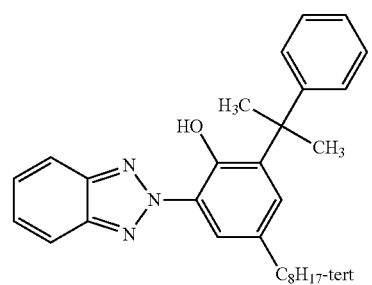

(UV-2)

(Production of Cellulose Ester Film)

A dope was prepared by adding ultraviolet absorber solution C-1 to a mixture of 94.6 parts by mass of the cellulose ester solution A-1 and 1.3 parts by mass of the matte agent dispersion B-1 such that the ultraviolet absorbing agent (UV-1) and the ultraviolet absorbing agent (UV-2) each become 1.0 part by mass per 100 parts by mass of cellulose acylate, and sufficiently stirring the mixture while heating the mixture to dissolve each component. The obtained dope was heated to 30° C., and was cast on a mirror surface stainless steel support which is a drum having a diameter of 3 m through a casting Giesser. The temperature of the surface of the mirror surface stainless steel support was set to −5° C., and the coating width was set to 1470 mm. The cast dope film was dried by applying dry air at 34° C. on the drum at 150 m$^3$/min, and was peeled from the drum in a state where the residual solvent was 150%. In the case of the peeling, 15% stretching was performed in a conveyance direction (longitudinal direction). Thereafter, both ends of the film in the width direction (a direction orthogonal to the casting direction) were conveyed while being gripped by a pin tenter (pin tenter disclosed in FIG. 3 of JP1992-1009A (JP-H04-1009A)), and the stretching treatment was not performed in the width direction. Furthermore, the film was further dried by being transported between rolls of a heat treatment device to manufacture a cellulose acylate film (T1). The amount of the residual solvent of the produced elongated cellulose acylate film (T1) was 0.2%, the thickness of the cellulose acylate film was 60 μm, and Re (in-plane retardation) and Rth (retardation in the thickness direction) at a wavelength of 550 nm were respectively 0.8 nm and 40 nm.

(Alkali Saponification Treatment)

The above-described cellulose acylate film (T1) was passed through a dielectric type heating roll at a temperature of 60° C., the temperature of the surface of the film was raised to 40° C., and then, the band surface of the film was coated with an alkaline solution of a composition shown below at a coating amount of 14 ml/m² using a bar coater. Thereafter, the cellulose acylate film coated with the alkaline solution was conveyed for 10 seconds under a steam type far infrared heater manufactured by NORITAKE CO., LIMITED which had been heated to 110° C. Subsequently, the top of the obtained film was coated with 3 ml/m² of pure water using a bar coater in the same manner. Next, washing of the obtained film with a fountain coater and draining of the obtained film with an air knife were repeated three times. Then, the film was conveyed to a drying zone at 70° C. and dried for 10 seconds to produce a cellulose acylate film subjected to an alkali saponification treatment.

Alkaline Solution Composition

| | |
|---|---|
| Potassium hydroxide | 4.7 parts by mass |
| Water | 15.8 parts by mass |
| Isopropanol | 63.7 parts by mass |
| Surfactant SF-1: $C_{14}H_{29}O(CH_2CH_2O)_{20}H$ | 1.0 part by mass |
| Propylene glycol | 14.8 parts by mass |

(Formation of Alignment Film)

The surface of the cellulose acylate film (T1) which had been subjected to the alkali saponification treatment was continuously coated with an alignment film coating solution (A) having the following composition, using a #14 wire bar. The film coated with the alignment film coating solution (A) was dried with hot air at 60° C. for 60 seconds and further with hot air at 100° C. for 120 seconds to form an alignment film. The degree of saponification of a modified polyvinyl alcohol used was 88%.

Composition of Alignment Film Coating Solution (A)

| | |
|---|---|
| Following modified polyvinyl alcohol | 10 parts by mass |
| Water | 308 parts by mass |
| Methanol | 70 parts by mass |
| Isopropanol | 29 parts by mass |
| Photopolymerization initiator (IRGACURE 2959 manufactured by Ciba Japan) | 0.8 parts by mass |

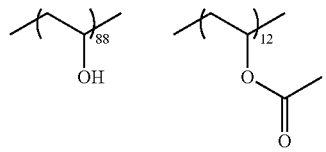

(Formation of Optically Anisotropic Layer A)

The produced alignment film was continuously subjected to a rubbing treatment. At this time, the longitudinal direction of the elongated film was parallel to the conveyance direction, and the angle formed by the film longitudinal direction (conveyance direction) and a rotation axis of a rubbing roller was set to 72.5° (in a case where the film longitudinal direction (conveyance direction) was set to 90° and the counterclockwise direction was represented by a positive value using the film width direction as a reference (0°) while performing an observation from the alignment film side, the rotation axis of the rubbing roller was at −17.5°. In other words, the position of the rotation axis of the rubbing roller corresponds to the position at which the rubbing roller was rotated counterclockwise by 72.5° using the film longitudinal direction as a reference).

The top of the alignment film produced above was continuously coated with an optically anisotropic layer coating solution (A) containing a discotic liquid crystal (DLC) compound having the following composition, using % 5.0 wire bar. The conveyance speed (V) of the film was set to 26 m/min. In order to dry a solvent of the coating solution and to align and mature the discotic liquid crystal compound (DLC compound), the film was heated with hot air at 115° C. for 90 seconds and subsequently with hot air at 80° C. for 60 seconds. Thereafter, UV (ultraviolet) irradiation (exposure amount: 70 mJ/cm²) was performed on the obtained coated film at 80° C. to immobilize the alignment of the liquid crystal compound. The thickness of the optically anisotropic layer A was 2.0 μm. The average inclination angle of the disk surface of the DLC compound with respect to the film surface was 90°, and therefore, it was confirmed that the DLC compound was aligned vertically on the film surface. In addition, the angle of the slow axis was −17.5° in cases where the slow axis was parallel to the rotation axis of the rubbing roller and the film longitudinal direction (conveyance direction) was set to 90° (the film width direction was set to 0° and the counterclockwise direction was represented by a positive value using the film width direction as a reference (0°) while performing an observation from the alignment film side). The obtained optically anisotropic layer A corresponded to a λ/2 plate, and Re and Rth at a wavelength of 550 nm were respectively Re (550): 238 nm and Rth (550): −119 nm.

Composition of Optically Anisotropic Layer Coating Solution (A)

| | |
|---|---|
| Following discotic liquid crystal compound (A) | 80 parts by mass |
| Following discotic liquid crystal compound (B) | 20 parts by mass |
| Ethylene oxide-modified trimethylolpropane triacrylate (V#360 manufactured by OSAKA ORGANIC CHEMICAL INDUSTRY LTD.) | 5 parts by mass |
| Photopolymerization initiator (IRGACURE 907 manufactured by Ciba Japan) | 4 parts by mass |
| Following pyridinium salt (A) | 2 parts by mass |
| Following polymer (A) | 0.2 parts by mass |
| Following polymer (B) | 0.1 parts by mass |
| Following polymer (C) | 0.1 parts by mass |
| Methyl ethyl ketone | 211 parts by mass |

Discotic liquid crystal compound (A)

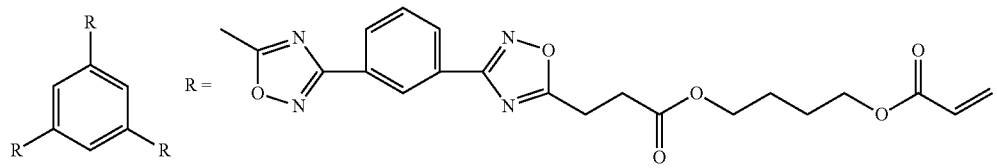

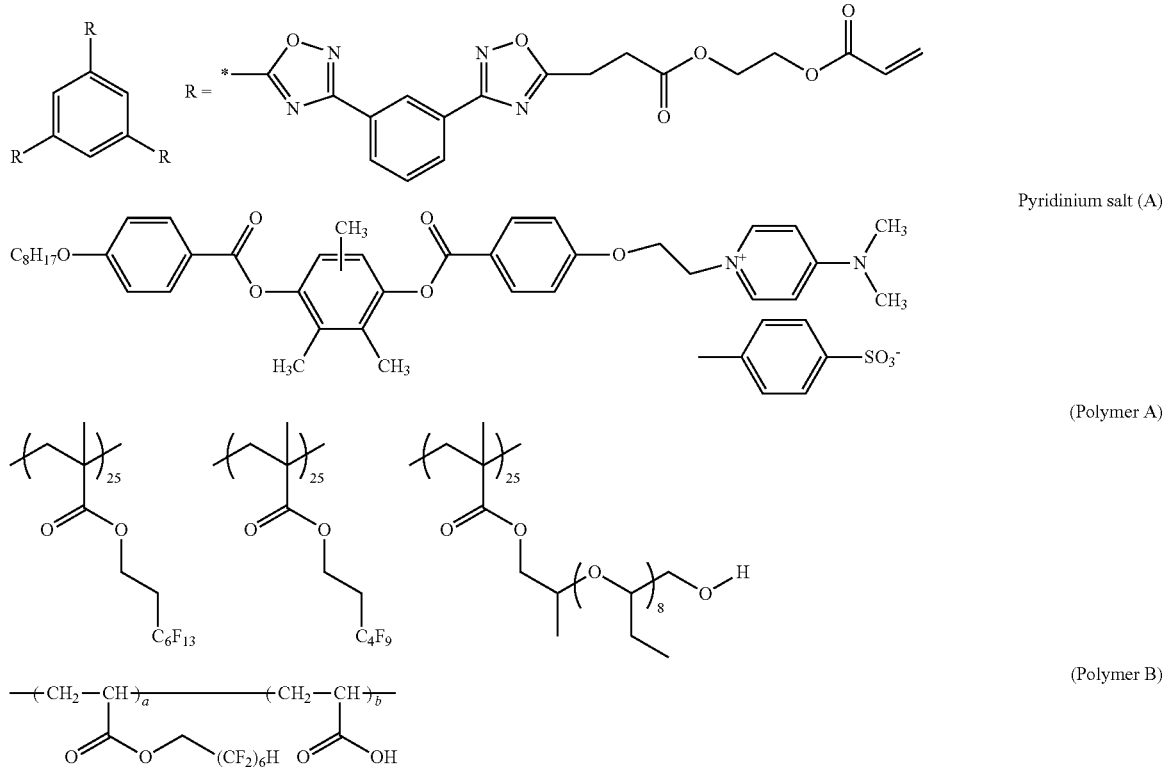

The above-described a represents 90 and b represents 10.

(2) Production of Optically Anisotropic Layer B
(Formation of Optically Anisotropic Layer B)

An alignment film was formed on a cellulose acylate film (T1) in accordance with the same procedure as in (Production of Optically Anisotropic Layer A) described above, and the formed alignment film was continuously subjected to a rubbing treatment. At this time, the longitudinal direction of the elongated film was parallel to the conveyance direction, and the angle formed by the film longitudinal direction (conveyance direction) and a rotation axis of a rubbing roller was set to 102.5° (in a case where the film longitudinal direction (conveyance direction) was set to 90° and the counterclockwise direction was represented by a positive value using the film width direction as a reference while performing an observation from the alignment film side, the rotation axis of the rubbing roller was at 12.5°. In other words, the position of the rotation axis of the rubbing roller corresponds to the position at which the rubbing roller was rotated counterclockwise by 102.5° using the film longitudinal direction as a reference).

The top of the alignment film after the rubbing treatment was continuously coated with an optically anisotropic layer coating solution (B) containing a discotic liquid crystal compound having the following composition, using %2.8 wire bar. The conveyance speed (V) of the film was set to 26 m/min. In order to dry a solvent of the coating solution and to align and mature the discotic liquid crystal compound, the film was heated with hot air at 60° C. for 60 seconds. Thereafter, UV irradiation was performed on the obtained coated film at 60° C. to immobilize the alignment of the discotic liquid crystal compound. The thickness of the optically anisotropic layer B was 0.8 μm. The average inclination angle of the major axis of the discotic liquid crystal compound with respect to the film surface was 90°, and therefore, it was confirmed that the discotic liquid crystal compound was aligned vertically on the film surface. In addition, the angle of the slow axis was 102.5° (−77.5°) in cases where the slow axis was orthogonal to the rotation axis of the rubbing roller and the film longitudinal direction was set to 90° (the film width direction was set to 0° and the counterclockwise direction was represented by a positive value using the film width direction as a reference (0°) while performing an observation from the alignment film side). The obtained optically anisotropic layer B corresponded to a λ/4 plate, and Re (550) was 118 nm and Rth (550) was −59 nm.

Composition of Optically Anisotropic Layer Coating Solution (B)

| | |
|---|---|
| Above-described discotic liquid crystal compound (A) | 80 parts by mass |

-continued

| | |
|---|---|
| Above-described discotic liquid crystal compound (B) | 20 parts by mass |
| Ethylene oxide-modified trimethylolpropane triacrylate (V#360 manufactured by OSAKA ORGANIC CHEMICAL INDUSTRY LTD.) | 10 parts by mass |
| Photopolymerization initiator (IRGACURE 907 manufactured by (Ciba Japan) | 5 parts by mass |
| Following pyridinium salt (A) | 1 part by mass |
| Following polymer (A) | 0.2 parts by mass |
| Following polymer (B) | 0.1 parts by mass |
| Following polymer (C) | 0.1 parts by mass |
| Methyl ethyl ketone | 348 parts by mass |

(3) Production of Polarizer

A polyvinyl alcohol (PVA) film having a thickness of 80 µm was immersed in an iodine aqueous solution having an iodine concentration of 0.05 mass % at 30° C. for 60 seconds to dye the film. Next, the dyed film was immersed in a boric acid aqueous solution having a boric acid concentration of 4 mass % for 60 seconds, and was longitudinally stretched by 5 times the original length while being immersed. Then, the film was dried for 4 minutes at 50° C. to obtain a polarizer having a thickness of 20 µm.

A commercially available cellulose acylate film "TD80UL" (manufactured by Fujifilm Corporation) was prepared and immersed in an aqueous sodium hydroxide solution at 1.5 mol/L at 55° C., and then, sodium hydroxide was sufficiently washed with water. Thereafter, the obtained film was immersed in a dilute sulfuric acid aqueous solution at 0.005 mol/L at 35° C. for 1 minute and was then immersed in water to sufficiently wash the dilute sulfuric acid aqueous solution. Finally, the film was sufficiently dried at 120° C. to produce a polarizer protective film.

The produced polarizer protective film was bound to a single surface of the produced polarizer with a polyvinyl alcohol adhesive to produce a polarizing plate including the polarizer and the polarizer protective film disposed on the single surface of the polarizer.

The polarizer side (where there is no polarizer protective film) in the produced polarizing plate was coated with a pressure sensitive adhesive (SK-2057 manufactured by Soken Chemical & Engineering Co., Ltd.) to form a pressure sensitive adhesive layer. The polarizer side was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X1 in which the polarizer, the optically anisotropic layer A ($\lambda/2$ plate), and the optically anisotropic layer B ($\lambda/4$ plate) were disposed in this order was produced through the above-described procedure. In a case where the counterclockwise direction was represented by a positive value using a transmission axis of the polarizer as a reference (0°) while performing an observation from the polarizer side, the angle of a slow axis of the $\lambda/2$ plate was −17.5° and the angle of a slow axis of the $\lambda/4$ plate was −77.5°.

That is, the angle formed by the slow axis of the optically anisotropic layer A ($\lambda/2$ plate) and the transmission axis of the polarizer was 17.5° and the angle formed by the slow axis of the optically anisotropic layer A ($\lambda/2$ plate) and the slow axis of the optically anisotropic layer B ($\lambda/4$ plate) was 60°

GALAXY S5 manufactured by SAMSUNG equipped with an organic EL panel (organic EL display element) was disassembled, a circular polarization plate-attached touch panel was peeled from the organic EL display device, and the circular polarization plate was further peeled from the touch panel to isolate the organic EL display element, the touch panel, and the circular polarization plate. Next, the isolated touch panel was pasted on the organic EL display element again, and the circular polarization plate X1 produced above was pasted on the touch panel so as not to contain air to produce an organic EL display device (refer to FIG. 1).

A transparent electrode layer which was formed of ITO and had a refractive index of 1.9 (measured at a wavelength of 550) was included in the touch panel.

In addition, an organic light emitting layer sandwiched between a pair of electrodes was included in the organic EL display element.

Example 2

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer. The polarizer side was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a cellulose acylate film A (with a thickness of 25 µm, and Re and Rth at a wavelength of 550 nm respectively being 0.8 nm and 9 nm) which had been prepared separately.

Next, a pressure sensitive adhesive layer was further formed on the surface of the bonded cellulose acylate film A through the above-described method. The laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X2 in which the polarizer, the optically anisotropic layer A, and the cellulose acylate film A, and the optically anisotropic layer B were disposed in this order was produced through the above-described procedure. In this embodiment, the optically anisotropic layer A corresponds to the λ/2 plate, and the laminated film of the cellulose acylate film A and the optically anisotropic layer B corresponds to the λ/4 plate.

An organic EL display device was produced in accordance with the same procedure as in Example 1 except that the above-described circular polarization plate X2 was used instead of the circular polarization plate X1 used in Example 1.

Example 3

An organic EL display device was produced in accordance with the same procedure as in Example 2 except that the cellulose acylate film A was changed to a cellulose acylate film B (with a thickness of 25 μm, and Re and Rth at a wavelength of 550 nm respectively being 4.0 nm and 36 nm).

Example 4

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer. The polarizer side was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to the above-described cellulose acylate film B which had been prepared separately.

Next, a pressure sensitive adhesive layer was formed on the surface of the bonded cellulose acylate film B through the above-described method to further bond a cellulose acylate film B thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X4 in which the polarizer, the optically anisotropic layer A, the cellulose acylate film B, the cellulose acylate film B, and the optically anisotropic layer B were disposed in this order was produced through the above-described procedure. In this embodiment, the optically anisotropic layer A corresponds to the λ/2 plate, and the laminated film of the cellulose acylate film B, the cellulose acylate film B, and the optically anisotropic layer B corresponds to the λ/4 plate.

An organic EL display device was produced in accordance with the same procedure as in Example 1 except that the above-described circular polarization plate X4 was used instead of the circular polarization plate X1 used in Example 1.

Example 5

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film A which had been separately prepared was bonded thereto.

Next, a pressure sensitive adhesive layer was further formed on the surface of the bonded cellulose acylate film A through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X5 in which the polarizer, the cellulose acylate film A, the optically anisotropic layer A, and the optically anisotropic layer B were disposed in this order was produced through the above-described procedure. In this embodiment, the laminated film of the cellulose acylate film A and the optically anisotropic layer A corresponds to the λ/2 plate, and the optically anisotropic layer B corresponds to the λ/4 plate.

An organic EL display device was produced in accordance with the same procedure as in Example 1 except that the above-described circular polarization plate X5 was used instead of the circular polarization plate X1 used in Example 1.

Example 6

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film A which had been separately prepared was bonded thereto.

Next, a pressure sensitive adhesive layer was further formed on the surface of the bonded cellulose acylate film A through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a cellulose acylate film A which had been prepared separately.

Next, a pressure sensitive adhesive layer was further formed on the surface of the bonded cellulose acylate film A through the above-described method. The laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X6 in which the polarizer, the cellulose acylate film A, the optically anisotropic layer A, the cellulose acylate film A, and the optically anisotropic layer B were disposed in this order was produced through the above-described procedure. In this embodiment, the laminated film of the cellulose acylate film A and the optically anisotropic layer A corresponds to the λ/2 plate, and the laminated film of the cellulose acylate film A and the optically anisotropic layer B corresponds to the λ/4 plate.

An organic EL display device was produced in accordance with the same procedure as in Example 1 except that the above-described circular polarization plate X6 was used instead of the circular polarization plate X1 used in Example 1.

Example 7

An organic EL display device was produced in accordance with the same procedure as in Example 6 except that the cellulose acylate film A adjacent to the optically anisotropic layer B was changed a cellulose acylate film B.

Example 8

An organic EL display device was produced in accordance with the same procedure as in Example 5 except that the cellulose acylate film A was changed a cellulose acylate film B.

Example 9

An organic EL display device was produced in accordance with the same procedure as in Example 6 except that the cellulose acylate film A adjacent to the polarizer was changed a cellulose acylate film B.

Example 10

An organic EL display device was produced in accordance with the same procedure as in Example 6 except that the two cellulose acylate films A were changed cellulose acylate films B.

Example 11

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film B which had been separately prepared was bonded thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a cellulose acylate film B which had been prepared separately.

Next, a pressure sensitive adhesive layer was formed on the surface of the bonded cellulose acylate film B through the above-described method to further bond a cellulose acylate film B thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X11 in which the polarizer, the cellulose acylate film B, the optically anisotropic layer A, the cellulose acylate film B, the cellulose acylate film B, and the optically anisotropic layer B were disposed in this order was produced through the above-described procedure. In this embodiment, the laminated film of the cellulose acylate film B and the optically anisotropic layer A corresponds to the λ/2 plate, and the laminated film of the cellulose acylate film B, the cellulose acylate film B, and the optically anisotropic layer B corresponds to the λ/4 plate.

An organic EL display device was produced in accordance with the same procedure as in Example 1 except that the above-described circular polarization plate X11 was used instead of the circular polarization plate X1 used in Example 1.

Example 12

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film B which had been separately prepared was bonded thereto.

Next, a pressure sensitive adhesive layer was formed on the surface of the bonded cellulose acylate film B through the above-described method to further bond a cellulose acylate film B thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A.

Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X12 in which the polarizer, the cellulose acylate film B, the cellulose acylate film B, the optically anisotropic layer A, and the optically anisotropic layer B were disposed in this order was produced through the above-described procedure. In this embodiment, the laminated film of the cellulose acylate film B, the cellulose acylate film B, and the optically anisotropic layer A corresponds to the $\lambda/2$ plate, and the optically anisotropic layer B corresponds to the $\lambda/4$ plate.

An organic EL display device was produced in accordance with the same procedure as in Example 1 except that the above-described circular polarization plate X12 was used instead of the circular polarization plate X1 used in Example 1.

Example 13

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film B which had been separately prepared was bonded thereto.

Next, a pressure sensitive adhesive layer was formed on the surface of the bonded cellulose acylate film B through the above-described method to further bond a cellulose acylate film B thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

The optically anisotropic layer A in the obtained laminate was further coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a cellulose acylate film B which had been prepared separately.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X13 in which the polarizer, the cellulose acylate film B, the cellulose acylate film B, the optically anisotropic layer A, the cellulose acylate film B, and the optically anisotropic layer B were disposed in this order was produced through the above-described procedure. In this embodiment, the laminated film of the cellulose acylate film B, the cellulose acylate film B, and the optically anisotropic layer A corresponds to the $\lambda/2$ plate, and the laminated film of the cellulose acylate film B and the optically anisotropic layer B corresponds to the $\lambda/4$ plate.

An organic EL display device was produced in accordance with the same procedure as in Example 1 except that the above-described circular polarization plate X13 was used instead of the circular polarization plate X1 used in Example 1.

Example 14

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film B which had been separately prepared was bonded thereto.

Next, a pressure sensitive adhesive layer was formed on the surface of the bonded cellulose acylate film B through the above-described method to further bond a cellulose acylate film B thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a cellulose acylate film B which had been prepared separately.

Next, a pressure sensitive adhesive layer was formed on the surface of the bonded cellulose acylate film B through the above-described method to further bond a cellulose acylate film B thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X14 in which the polarizer, the cellulose acylate film B, the cellulose acylate film B, the optically anisotropic layer A, the cellulose acylate film B, the cellulose acylate film B, and the optically anisotropic layer B were disposed in this order was produced through the above-described procedure. In this embodiment, the laminated film of the cellulose acylate film B, the cellulose acylate film B, and the optically anisotropic layer A corresponds to the λ/2 plate, and the laminated film of the cellulose acylate film B, the cellulose acylate film B, and the optically anisotropic layer B corresponds to the λ/4 plate.

An organic EL display device was produced in accordance with the same procedure as in Example 1 except that the above-described circular polarization plate X14 was used instead of the circular polarization plate X1 used in Example 1.

Example 15

(Formation of Optically Anisotropic Layers C and D (Rod-Like Liquid Crystal Vertical Alignment Film))
(Production of Peelable Support)
An alignment film was produced as below without performing an alkali saponification treatment on a cellulose acylate film to produce a peelable support.
(Formation of Alignment Film)
The cellulose acylate film was continuously coated with an alignment film coating solution (B) having the following composition, using a #14 wire bar. The cellulose acylate film was dried with hot air at 60° C. for 60 seconds and further with hot air at 100° C. for 120 seconds.

Composition of Alignment Film Coating Solution (B)

| | |
|---|---|
| Following modified polyvinyl alcohol-2 | 10 parts by mass |
| Water | 371 parts by mass |
| Methanol | 119 parts by mass |
| Glutaraldehyde (crosslinking agent) | 0.5 parts by mass |
| Citric acid ester (AS3 manufactured by SANKYO CHEMICAL INDUSTRY CO., LTD) | 0.175 parts by mass |
| Photopolymerization initiator (IRGACURE 2959 manufactured by Ciba Japan) | 2.0 parts by mass |

[Modified polyvinyl alcohol-2]

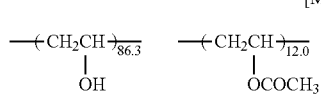

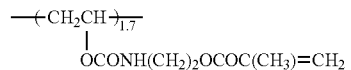

The top of the alignment film produced above was continuously coated with an optically anisotropic layer coating solution (C) containing a rod-like liquid crystal compound having the following composition, using a wire bar. The conveyance speed (V) of the film was set to 26 m/min. In order to dry a solvent of the coating solution and to align and mature the rod-like liquid crystal compound, the film was heated with hot air at 60° C. for 60 seconds, UV irradiation was performed on the film at 60° C., and the alignment of the rod-like liquid crystal compound was immobilized to produce a rod-like liquid crystal vertical alignment film. The average inclination angle of the major axis of the rod-like liquid crystal compound with respect to the film surface was 90°, and therefore, it was confirmed that the rod-like liquid crystal compound was aligned vertically on the film surface. Two rod-like liquid crystal vertical alignment films were produced by changing the thickness.

The thickness of the optically anisotropic layer C was 0.8 µm, and Re (550) and Rth (550) were respectively 0 nm and −65 nm.

The thickness of the optically anisotropic layer D was 2.0 µm, and Re (550) and Rth (550) were respectively 0 nm and −160 nm.

Composition of Optically Anisotropic Layer Coating Solution (C)

| | |
|---|---|
| Rod-like liquid crystal compound-1 | 80 parts by mass |
| Rod-like liquid crystal compound-2 | 20 parts by mass |
| Photopolymerization initiator (IRGACURE 907 manufactured by Ciba Japan) | 3 parts by mass |
| Sensitizer (KAYACURE DETX manufactured by Nippon Kayaku Co., Ltd.) | 1 part by mass |
| Fluorine-containing compound (FP-2) | 0.3 parts by mass |
| Alignment film interface alignment agent-1 | 0.55 parts by mass |
| Methyl ethyl ketone | 193 parts by mass |

[Rod-like liquid crystal compound-1]

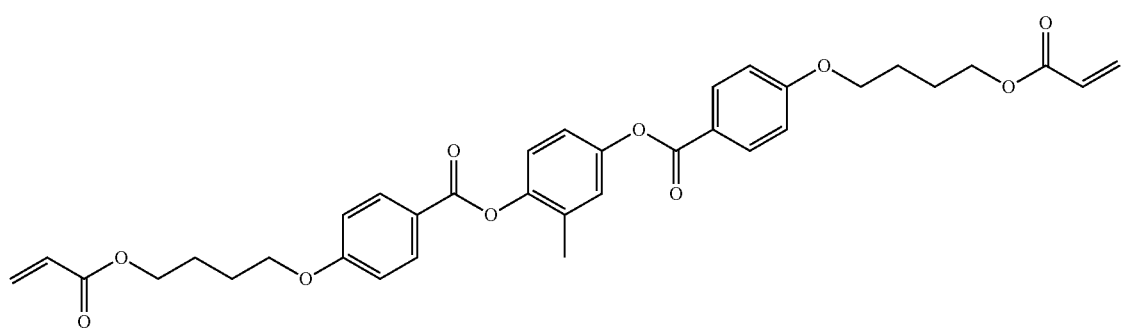

[Rod-like liquid crystal compound-2]

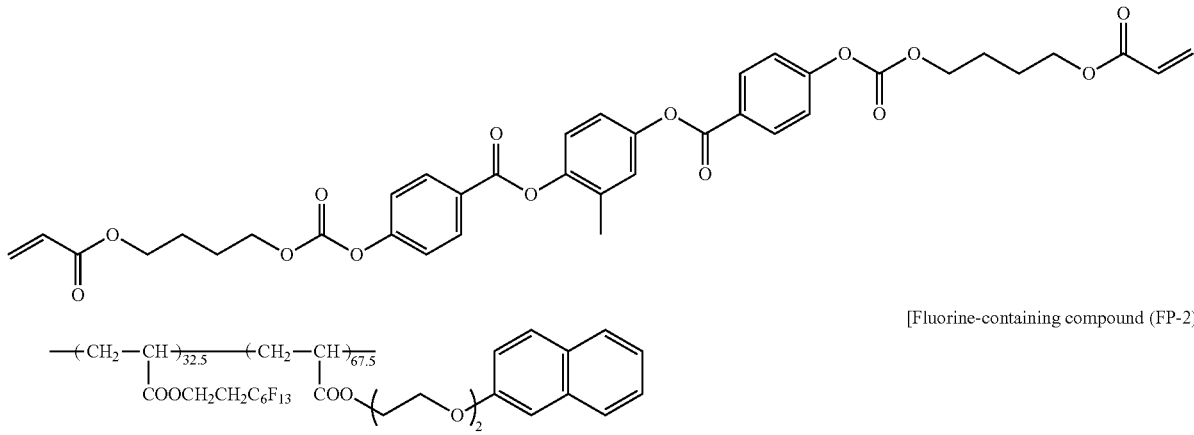

[Fluorine-containing compound (FP-2)]

(Formation of Optically Anisotropic Layers E and F (Rod-Like Liquid Crystal Horizontal Alignment Film))

A peelable support and an alignment film were produced in accordance with the above-described procedure.

The top of the alignment film produced above was continuously coated with an optically anisotropic layer coating solution (D) containing a rod-like liquid crystal compound having the following composition, using a wire bar. The conveyance speed (V) of the film was set to 26 m/min. In order to dry a solvent of the coating solution and to align and mature the rod-like liquid crystal compound, the film was heated with hot air at 60° C. for 60 seconds, UV irradiation was performed on the film at 60° C., and the alignment of the rod-like liquid crystal compound was immobilized to produce a rod-like liquid crystal horizontal alignment film. The average inclination angle of the major axis of the rod-like liquid crystal compound with respect to the film surface was 0°, and therefore, it was confirmed that the rod-like liquid crystal compound was aligned horizontally on the film surface.

Two rod-like liquid crystal horizontal alignment films were produced by changing the thickness.

The angle of a slow axis of the rod-like liquid crystal compound was 102.5° (−77.5°) in the optically anisotropic layer E and −17.5° in the optically anisotropic layer F in cases where the slow axis thereof was orthogonal to a rotation axis of a rubbing roller and the film longitudinal direction was set to 90° (the film width direction was set to 0° and the counterclockwise direction was represented by a positive value using the film width direction as a reference (0°) while performing an observation from the alignment film side).

Re (550) of the optically anisotropic layer E was 118 nm and Rth (550) thereof was 59 nm.

Re (550) of the optically anisotropic layer F was 238 nm and Rth (550) thereof was 119 nm.

Composition of Optically Anisotropic Layer Coating Solution (D)

| | |
|---|---|
| Rod-like liquid crystal compound-1 | 80 parts by mass |
| Rod-like liquid crystal compound-2 | 20 parts by mass |
| Photopolymerization initiator (IRGACURE 907 manufactured by Ciba Japan) | 3 parts by mass |
| Sensitizer (KAYACURE DETX manufactured by Nippon Kayaku Co., Ltd.) | 1 part by mass |
| Fluorine-containing compound (FP-2) | 1.0 part by mass |
| Methyl ethyl ketone | 193 parts by mass |

[Rod-like liquid crystal compound-1]

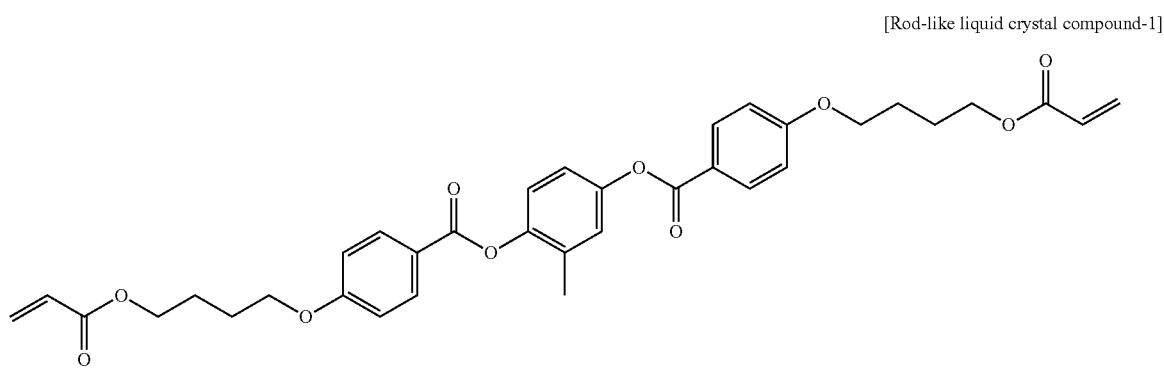

-continued

[Rod-like liquid crystal compound-2]

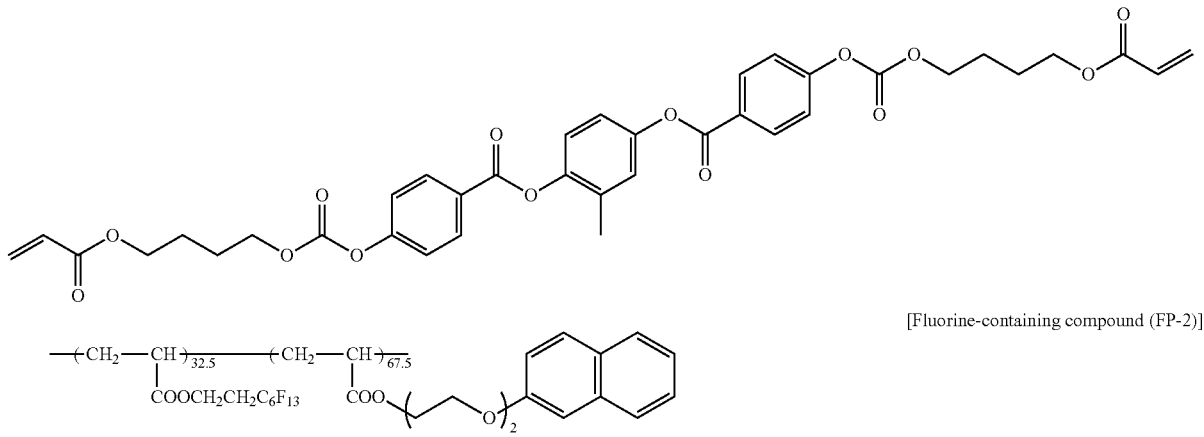

[Fluorine-containing compound (FP-2)]

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film B which had been separately prepared was bonded thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer C produced above so that the pressure sensitive adhesive layer was closely attached to the optically anisotropic layer C. Thereafter, the cellulose acylate film was peeled to obtain a laminate.

The optically anisotropic layer C in the obtained laminate was further coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer E produced above so that the pressure sensitive adhesive layer was closely attached to the optically anisotropic layer E. Thereafter, the cellulose acylate film was peeled to obtain a laminate.

A circular polarization plate X15 in which the polarizer, the cellulose acylate film B, the optically anisotropic layer A, the optically anisotropic layer C, and the optically anisotropic layer E were disposed in this order was produced through the above-described procedure. In this embodiment, the laminated film of the cellulose acylate film B and the optically anisotropic layer A corresponds to the λ/2 plate, and the laminated film of the optically anisotropic layer C and the optically anisotropic layer E corresponds to the λ/4 plate.

An organic EL display device was produced in accordance with the same procedure as in Example 1 except that the above-described circular polarization plate X15 was used instead of the circular polarization plate X1 used in Example 1.

Example 16

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer. The polarizer side was bonded to a film having the cellulose acylate film, the alignment film, and the optically anisotropic layer D produced above so that the pressure sensitive adhesive layer was closely attached to the optically anisotropic layer D. Thereafter, the cellulose acylate film was peeled to obtain a laminate.

Next, the optically anisotropic layer D in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer F produced above so that the pressure sensitive adhesive layer was closely attached to the optically anisotropic layer F. Thereafter, the cellulose acylate film and the alignment film were peeled to obtain a laminate.

Next, the optically anisotropic layer F in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer C produced above so that the pressure sensitive adhesive layer was closely attached to the optically anisotropic layer C. Thereafter, the cellulose acylate film was peeled to obtain a laminate.

Next, the optically anisotropic layer C in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer E produced above so that the pressure sensitive adhesive layer was closely attached to the optically anisotropic layer E. Thereafter, the cellulose acylate film was peeled to obtain a laminate.

A circular polarization plate X16 in which the polarizer, the optically anisotropic layer D, the optically anisotropic layer F, the optically anisotropic layer C, and the optically anisotropic layer E were disposed in this order was produced through the above-described procedure. In this embodiment, the laminated film of the optically anisotropic layer D and the optically anisotropic layer F corresponds to the $\lambda/2$ plate, and the laminated film of the optically anisotropic layer C and the optically anisotropic layer E corresponds to the $\lambda/4$ plate.

An organic EL display device was produced in accordance with the same procedure as in Example 1 except that the above-described circular polarization plate X16 was used instead of the circular polarization plate X1 used in Example 1.

Example 17

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer. The polarizer side was bonded to a film having the cellulose acylate film, the alignment film, and the optically anisotropic layer D produced above so that the pressure sensitive adhesive layer was closely attached to the optically anisotropic layer D. Thereafter, the cellulose acylate film was peeled to obtain a laminate.

Next, a pressure sensitive adhesive layer was formed on the optically anisotropic layer D in the obtained laminate. Next, a film A (cycloolefin polymer film A) (with a thickness of 32 μm, and Re and Rth at a wavelength of 550 nm respectively being 238 nm and 119 nm) obtained by stretching a commercially available cycloolefin polymer film "ZEONOR ZF14" (manufactured by Optes Inc) was bonded to the pressure sensitive adhesive layer to obtain a laminate.

Next, the cycloolefin polymer film A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer C produced above so that the pressure sensitive adhesive layer was closely attached to the optically anisotropic layer C. Thereafter, the cellulose acylate film was peeled to obtain a laminate. A pressure sensitive adhesive layer was further formed on the optically anisotropic layer C in the obtained laminate.

Next, a film B (cycloolefin polymer film B) (with a thickness of 28 μm, and Re and Rth at a wavelength of 550 nm respectively being 118 nm and 59 nm) obtained by stretching a commercially available cycloolefin polymer film "ZEONOR ZF14" (manufactured by Optes Inc) was bonded to the laminate on which the pressure sensitive adhesive layer was disposed, to obtain a laminate.

A circular polarization plate X17 in which the polarizer, the optically anisotropic layer D, the cycloolefin polymer film A, the optically anisotropic layer C, and the cycloolefin polymer film B were disposed in this order was produced through the above-described procedure. In this embodiment, the laminated film of the optically anisotropic layer D and the cycloolefin polymer film A corresponds to the $\lambda/2$ plate, and the laminated film of the optically anisotropic layer C and the cycloolefin polymer film B corresponds to the $\lambda/4$ plate.

An organic EL display device was produced in accordance with the same procedure as in Example 1 except that the above-described circular polarization plate X17 was used instead of the circular polarization plate X1 used in Example 1.

Comparative Example 1

(Formation of Optically Anisotropic Layer G (Rod-Like Liquid Crystal Vertical Alignment Film))

An optically anisotropic layer G (rod-like liquid crystal vertical alignment film) was produced in accordance with the procedure of (Formation of Optically Anisotropic Layers C and D (Rod-like Liquid Crystal Vertical Alignment Film)) described in Example 15 except that the thickness of the optically anisotropic layer was changed to 0.25 μm.

The thickness of the optically anisotropic layer G was 0.25 μm, and Re (550) and Rth (550) were respectively 0 nm and −20 nm.

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer. The polarizer side was bonded to a film having the cellulose acylate film, the alignment film, and the optically anisotropic layer G produced above so that the pressure sensitive adhesive layer was closely attached to the optically anisotropic layer G. Thereafter, the cellulose acylate film was peeled to obtain a laminate.

Next, the optically anisotropic layer G in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X18 in which the polarizer, the optically anisotropic layer G, the optically anisotropic layer A, and the optically anisotropic layer B were disposed in this order was produced through the above-described procedure. In this embodiment, the laminated film of the optically anisotropic layer G and the optically anisotropic layer A corresponds to the λ/2 plate, and the optically anisotropic layer B corresponds to the λ/4 plate.

An organic EL display device was produced in accordance with the same procedure as in Example 1 except that the above-described circular polarization plate X18 was used instead of the circular polarization plate X1 used in Example 1.

Comparative Example 2

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer. The polarizer side was bonded to a film having the cellulose acylate film, the alignment film, and the optically anisotropic layer G produced above so that the pressure sensitive adhesive layer was closely attached to the optically anisotropic layer G. Thereafter, the cellulose acylate film was peeled to obtain a laminate.

Next, the optically anisotropic layer G in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to the above-described cellulose acylate film B which had been prepared separately.

Next, a pressure sensitive adhesive layer was formed on the surface of the bonded cellulose acylate film B through the above-described method to further bond a cellulose acylate film B thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X19 in which the polarizer, the optically anisotropic layer G, the optically anisotropic layer A, the cellulose acylate film B, the cellulose acylate film B, and the optically anisotropic layer B were disposed in this order was produced through the above-described procedure. In this embodiment, the laminated film of the optically anisotropic layer G and the optically anisotropic layer A corresponds to the λ/2 plate, and the laminated film of the cellulose acylate film B, the cellulose acylate film B, and the optically anisotropic layer B corresponds to the λ/4 plate.

An organic EL display device was produced in accordance with the same procedure as in Example 1 except that the above-described circular polarization plate X19 was used instead of the circular polarization plate X1 used in Example 1.

Comparative Example 3

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film C (with a thickness of 45 µm, and Re and Rth at a wavelength of 550 nm respectively being 0.5 nm and 116 nm) which had been separately prepared was bonded thereto.

Next, a pressure sensitive adhesive layer was further formed on the surface of the bonded cellulose acylate film C through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

Next, the optically anisotropic layer A in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer B produced above so that the pressure sensitive adhesive layer was closely attached to the optically anisotropic layer B. Thereafter, the cellulose acylate film and the alignment film were peeled.

A circular polarization plate X20 in which the polarizer, the cellulose acylate film C, the optically anisotropic layer A, and the optically anisotropic layer B were disposed in this order was produced through the above-described procedure. In this embodiment, the laminated film of the cellulose acylate film C and the optically anisotropic layer A corresponds to the λ/2 plate, and the optically anisotropic layer B corresponds to the λ/4 plate.

An organic EL display device was produced in accordance with the same procedure as in Example 1 except that the above-described circular polarization plate X20 was used instead of the circular polarization plate X1 used in Example 1.

Comparative Example 4

An organic EL display device was produced in accordance with the same procedure as in Example 6 except that the cellulose acylate film A adjacent to the polarizer was changed to the cellulose acylate film C.

Comparative Example 5

An organic EL display device was produced in accordance with the same procedure as in Example 7 except that the cellulose acylate film A adjacent to the polarizer was changed to the cellulose acylate film C.

Comparative Example 6

An organic EL display device was produced in accordance with the same procedure as in Example 11 except that the cellulose acylate film B adjacent to the polarizer was changed to the cellulose acylate film C.

Comparative Example 7

An organic EL display device was produced in accordance with the same procedure as in Comparative Example 5 except that the cellulose acylate film B was changed to the cellulose acylate film C.

Comparative Example 8

An organic EL display device was produced in accordance with the same procedure as in Comparative Example 7 except that the cellulose acylate film C adjacent to the polarizer was not used.

Comparative Example 9

An organic EL display device was produced in accordance with the same procedure as in Comparative Example 7 except that the cellulose acylate film C adjacent to the polarizer was changed to the cellulose acylate film A.

Comparative Example 10

An organic EL display device was produced in accordance with the same procedure as in Comparative Example 7 except that the cellulose acylate film C adjacent to the polarizer was changed to the cellulose acylate film B.

Comparative Example 11

An organic EL display device was produced in accordance with the same procedure as in Example 13 except that the cellulose acylate film B adjacent to the optically anisotropic layer B was changed to the cellulose acylate film C.

Comparative Example 12

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film B which had been separately prepared was bonded thereto.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer A produced above so that the pressure sensitive adhesive layer was closely attached to the optically anisotropic layer A. Thereafter, the cellulose acylate film and the alignment film were peeled to obtain a laminate.

The optically anisotropic layer A in the obtained laminate was further coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a film having the cellulose acylate film, the alignment film, and the optically anisotropic layer E produced above so that the pressure sensitive adhesive layer was closely attached to the optically anisotropic layer E. Thereafter, the cellulose acylate film was peeled to obtain a laminate.

A circular polarization plate X29 in which the polarizer, the cellulose acylate film B, the optically anisotropic layer A, and the optically anisotropic layer E were disposed in this order was produced through the above-described procedure. In this embodiment, the laminated film of the cellulose acylate film B and the optically anisotropic layer A corresponds to the $\lambda/2$ plate, and the optically anisotropic layer E corresponds to the $\lambda/4$ plate.

An organic EL display device was produced in accordance with the same procedure as in Example 1 except that the above-described circular polarization plate X29 was used instead of the circular polarization plate X1 used in Example 1.

Comparative Example 13

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a cellulose acylate film B which had been separately prepared was bonded thereto.

Next, a pressure sensitive adhesive layer was further formed on the surface of the bonded cellulose acylate film B through the above-described method. Next, the laminate on which the pressure sensitive adhesive layer was disposed was bonded to a film having the cellulose acylate film, the alignment film, and the optically anisotropic layer F produced above so that the pressure sensitive adhesive layer was closely attached to the optically anisotropic layer F. Thereafter, the cellulose acylate film and the alignment film were peeled to obtain a laminate.

Next, the optically anisotropic layer F in the obtained laminate was coated with the pressure sensitive adhesive (SK-2057 manufactured by Soken Chemical & Engineering Co., Ltd.) to form a pressure sensitive adhesive layer. Next, the laminate on which the pressure sensitive adhesive layer was disposed was bonded to a cellulose acylate film B which had been prepared separately.

Next, a pressure sensitive adhesive layer was further formed on the surface of the bonded cellulose acylate film B through the above-described method. The laminate on which the pressure sensitive adhesive layer was disposed was bonded to a film having the cellulose acylate film, the alignment film, and the optically anisotropic layer E produced above so that the pressure sensitive adhesive layer was closely attached to the optically anisotropic layer E. Thereafter, the cellulose acylate film and the alignment film were peeled.

A circular polarization plate X30 in which the polarizer, the cellulose acylate film B, the optically anisotropic layer F, the cellulose acylate film B, and the optically anisotropic layer E were disposed in this order was produced through the above-described procedure. In this embodiment, the laminated film of the cellulose acylate film B and the optically anisotropic layer F corresponds to the $\lambda/2$ plate, and the laminated film of the cellulose acylate film B and the optically anisotropic layer E corresponds to the $\lambda/4$ plate.

An organic EL display device was produced in accordance with the same procedure as in Example 1 except that the above-described circular polarization plate X30 was used instead of the circular polarization plate X1 used in Example 1.

Comparative Example 14

The polarizer side (where there is no polarizer protective film) in the polarizing plate produced in Example 1 was coated with a pressure sensitive adhesive (SK-2057 manufactured by Soken Chemical & Engineering Co., Ltd.) to form a pressure sensitive adhesive layer, and a film C (cycloolefin polymer film C) (with a thickness of 32 μm, and Re and Rth at a wavelength of 550 nm respectively being 270 nm and 135 nm) obtained by stretching a commercially available cycloolefin polymer film "ZEONOR ZF14" (manufactured by Optes Inc) was bonded to the pressure sensitive adhesive layer to obtain a laminate.

Next, the cycloolefin polymer film C in the obtained laminate was coated with the pressure sensitive adhesive (SK-2057 manufactured by Soken Chemical & Engineering Co., Ltd.) to form a pressure sensitive adhesive layer. Next, a film D (cycloolefin polymer film D) (with a thickness of 28 μm, and Re and Rth at a wavelength of 550 nm respectively being 138 nm and 69 nm) obtained by stretching a commercially available cycloolefin polymer film "ZEONOR ZF14" (manufactured by Optes Inc) was bonded to the laminate on which the pressure sensitive adhesive layer was disposed, to obtain a laminate.

A circular polarization plate X31 in which the polarizer, the cycloolefin polymer film C, and the cycloolefin polymer film D were disposed in this order was produced through the above-described procedure. In this embodiment, the cycloolefin polymer film C corresponds to the λ/2 plate, and the cycloolefin polymer film D corresponds to the λ/4 plate.

An organic EL display device was produced in accordance with the same procedure as in Example 1 except that the above-described circular polarization plate X31 was used instead of the circular polarization plate X1 used in Example 1.

Comparative Example 15

GALAXY S5 manufactured by SAMSUNG equipped with an organic EL panel (organic EL display element) was disassembled, and a circular polarization plate-attached touch panel was peeled from the organic EL display device, to isolate the organic EL display element. Subsequently, the circular polarization plate X1 produced above was pasted on the electrode of the organic EL display element so as not to contain air to produce an organic EL display device.

In Comparative Example 15, no touch panel was included in the organic EL display device.

Comparative Example 16

An organic EL display device was produced in accordance with the same procedure as in Comparative Example 15 except that the circular polarization plate X1 was changed to a circular polarization plate X2.

Comparative Example 17

An isotropic roll-like triacetyl cellulose film (hereinafter, referred to as a "cellulose acylate film D"), an optically anisotropic layer (A) (hereinafter, referred to as an "optically anisotropic layer H"), and an optically anisotropic layer (B) (hereinafter, referred to as an "optically anisotropic layer I") used in Example 4 of JP2003-262727A were bonded to the polarizer in the polarizing plate produced in Example 1 through a pressure sensitive adhesive layer formed of a pressure sensitive adhesive (SK-2057 manufactured by Soken Chemical & Engineering Co., Ltd.) to obtain a laminate.

A circular polarization plate X34 in which the polarizer, the cellulose acylate film D, the optically anisotropic layer H, and the optically anisotropic layer I were disposed in this order was produced through the above-described procedure. In this embodiment, the laminated film of the cellulose acylate film D and the optically anisotropic layer H corresponds to the λ/2 plate, and the optically anisotropic layer I corresponds to the λ/4 plate.

An organic EL display device was produced in accordance with the same procedure as in Example 1 except that the above-described circular polarization plate X34 was used instead of the circular polarization plate X1 used in Example 1.

In Comparative Example 17, the λ/4 plate does not satisfy the above-described requirements as shown in Table 1 to be described below.

In the organic EL display devices of Examples 1 to 17 and Comparative Examples 1 to 17 described above, in a case where the counterclockwise direction was represented by a positive value using a transmission axis of a polarizer as a reference (0°) while performing an observation from the polarizer side, the angle of a slow axis of a λ/2 plate was −17.5° and the angle of a slow axis of a λ/4 plate was −77.5°.

That is, the angle formed by the slow axis of the λ/2 plate and the transmission axis of the polarizer is 17.5° and the angle formed by the slow axis of the λ/2 plate and the slow axis of the λ/4 plate is 60°

Re (550) of each λ/2 plate in the organic EL display devices of Examples 1 to 17 described above satisfies 210 nm Re (550) 300 nm.

Re (550) of each λ/4 plate in the organic EL display devices of Examples 1 to 17 described above satisfies 100 nm Re (550) 160 nm.

<Evaluation>

(Evaluation of 45° Reflectivity and Reflective Tint)

Each of the organic EL display device produced above was fixed to SR-3 (manufactured by TOPCON CORPORATION) with an inclination of 45°, and the brightness (L*) and the tint (a*/b*) were measured under fluorescent light. ΔEab was defined by Equation (1) from the obtained brightness (L*) and the tint (a*/b*).

$$\Delta Eab = \{(L^*)^2 + (a^*)^2 + (b^*)^2\}^{0.5} \quad \text{(Equation 1)}$$

ΔEab represents a distance from an origin in the L*a*b* space. A smaller ΔEab value indicates higher black reproducibility. For practical use, ΔEab is preferably less than 30. The results are shown in Table 1.

In Table 1, "TAC_A" represents a cellulose acylate film A, "TAC_B" represents a cellulose acylate film B, "TAC_C" represents a cellulose acylate film C, and "TAC_D" represents a cellulose acylate film D.

"COP film A" represents a cycloolefin polymer film A, "COP film B" represents a cycloolefin polymer film B, "COP film C" represents a cycloolefin polymer film C, and "COP film D" represents a cycloolefin polymer film D.

The "phase difference layer thickness" in Table 1 is intended to be a total thickness of a λ/2 plate and a λ/4 plate.

TABLE 1

| | Presence or absence of touch panel | Configuration | | | |
|---|---|---|---|---|---|
| | | λ/2 plate | | λ/4 plate | |
| | | First optically anisotropic layer | Second optically anisotropic layer | Third optically anisotropic layer | Fourth optically anisotropic layer |
| Example 1 | Presence | — | Optically anisotropic layer A | — | Optically anisotropic layer B |
| Example 2 | Presence | — | Optically anisotropic layer A | TAC_A | Optically anisotropic layer B |
| Example 3 | Presence | — | Optically anisotropic layer A | TAC_B | Optically anisotropic layer B |
| Example 4 | Presence | — | Optically anisotropic layer A | TAC_B × 2 sheets | Optically anisotropic layer B |
| Example 5 | Presence | TAC_A | Optically anisotropic layer A | — | Optically anisotropic layer B |
| Example 6 | Presence | TAC_A | Optically anisotropic layer A | TAC_A | Optically anisotropic layer B |
| Example 7 | Presence | TAC_A | Optically anisotropic layer A | TAC_B | Optically anisotropic layer B |
| Example 8 | Presence | TAC_B | Optically anisotropic layer A | — | Optically Anisotropic layer B |
| Example 9 | Presence | TAC_B | Optically anisotropic layer A | TAC_A | Optically anisotropic layer B |
| Example 10 | Presence | TAC_B | Optically anisotropic layer A | TAC_B | Optically anisotropic layer B |
| Example 11 | Presence | TAC_B | Optically anisotropic layer A | TAC_B × 2 sheets | Optically anisotropic layer B |
| Example 12 | Presence | TAC_B × 2 sheets | Optically anisotropic layer A | — | Optically anisotropic layer B |
| Example 13 | Presence | TAC_B × 2 sheets | Optically anisotropic layer A | TAC_B | Optically anisotropic layer B |
| Example 14 | Presence | TAC_B × 2 sheets | Optically anisotropic layer A | TAC_B × 2 sheets | Optically anisotropic layer B |
| Example 15 | Presence | TAC_B | Optically anisotropic layer A | Optically anisotropic layer C | Optically anisotropic layer E |
| Example 16 | Presence | Optically anisotropic layer D | Optically anisotropic layer F | Optically anisotropic layer C | Optically Anisotropic layer E |
| Example 17 | Presence | Optically anisotropic layer D | COP Film A | Optically anisotropic layer C | COP Film B |
| Comparative Example 1 | Presence | Optically anisotropic layer G | Optically anisotropic layer A | — | Optically anisotropic layer B |
| Comparative Example 2 | Presence | Optically anisotropic layer G | Optically anisotropic layer A | TAC_B × 2 sheets | Optically anisotropic layer B |
| Comparative Example 3 | Presence | TAC_C | Optically anisotropic layer A | — | Optically Anisotropic layer B |
| Comparative Example 4 | Presence | TAC_C | Optically anisotropic layer A | TAC_A | Optically anisotropic layer B |
| Comparative Example 5 | Presence | TAC_C | Optically anisotropic layer A | TAC_B | Optically anisotropic layer B |
| Comparative Example 6 | Presence | TAC_C | Optically anisotropic layer A | TAC_B × 2 sheets | Optically Anisotropic layer B |
| Comparative Example 7 | Presence | TAC_C | Optically anisotropic layer A | TAC_C | Optically anisotropic layer B |

TABLE 1-continued

| | | | | | |
|---|---|---|---|---|---|
| Comparative Example 8 | Presence | — | Optically anisotropic layer A | TAC_C | Optically anisotropic layer B |
| Comparative Example 9 | Presence | TAC_A | Optically anisotropic layer A | TAC_C | Optically Anisotropic layer B |
| Comparative Example 10 | Presence | TAC_B | Optically anisotropic layer A | TAC_C | Optically anisotropic layer B |
| Comparative Example 11 | Presence | TAC_B × 2 sheets | Optically anisotropic layer A | TAC_C | Optically anisotropic layer B |
| Comparative Example 12 | Presence | TAC_B | Optically anisotropic layer A | — | Optically anisotropic layer E |
| Comparative Example 13 | Presence | TAC_B | Optically anisotropic layer F | TAC_B | Optically anisotropic layer E |
| Comparative Example 14 | Presence | — | COP Film C | — | COP Film D |
| Comparative Example 15 | Absence | — | Optically anisotropic layer A | — | Optically anisotropic layer B |
| Comparative Example 16 | Absence | — | Optically anisotropic layer A | TAC_A | Optically Anisotropic layer B |
| Comparative Example 17 | Presence | | | JP2003-262727A | |

| | Rth (nm) | | | | | | Phase |
|---|---|---|---|---|---|---|---|
| | λ/2 plate | | | λ/4 plate | | | |
| | First optically anisotropic layer | Second optically anisotropic layer | Total RthA | Third optically anisotropic layer | Fourth optically anisotropic layer | Total RthB | Polar angle 45° ΔEab | difference layer thickness [μm] |
| Example 1 | 0 | −119 | −119 | 0 | −59 | −59 | 25 | 3 |
| Example 2 | 0 | −119 | −119 | 9 | −59 | −50 | 25 | 28 |
| Example 3 | 0 | −119 | −119 | 36 | −59 | −23 | 24 | 43 |
| Example 4 | 0 | −119 | −119 | 73 | −59 | 14 | 25 | 83 |
| Example 5 | 9 | −119 | −110 | 0 | −59 | −59 | 25 | 28 |
| Example 6 | 9 | −119 | −110 | 9 | −59 | −50 | 24 | 53 |
| Example 7 | 9 | −119 | −110 | 36 | −59 | −23 | 24 | 68 |
| Example 8 | 36 | −119 | −83 | 0 | −59 | −59 | 27 | 43 |
| Example 9 | 36 | −119 | −83 | 9 | −59 | −50 | 26 | 68 |
| Example 10 | 36 | −119 | −83 | 36 | −59 | −23 | 26 | 83 |
| Example 11 | 36 | −119 | −83 | 73 | −59 | 14 | 27 | 123 |
| Example 12 | 73 | −119 | −46 | 0 | −59 | −59 | 27 | 83 |
| Example 13 | 73 | −119 | −46 | 36 | −59 | −23 | 26 | 123 |
| Example 14 | 73 | −119 | −46 | 73 | −59 | 14 | 27 | 163 |
| Example 15 | 36 | −119 | −83 | −65 | 59 | −6 | 26 | 44 |
| Example 16 | −160 | 119 | −41 | −65 | 59 | −6 | 26 | 5 |
| Example 17 | −160 | 119 | −41 | −65 | 59 | −6 | 26 | 63 |
| Comparative Example 1 | −20 | −119 | −139 | 0 | −59 | −59 | 31 | 4 |
| Comparative Example 2 | −20 | −119 | −139 | 73 | −59 | 14 | 32 | 84 |
| Comparative Example 3 | 116 | −119 | −3 | 0 | −59 | −59 | 34 | 48 |
| Comparative Example 4 | 116 | −119 | −3 | 9 | −59 | −50 | 31 | 73 |
| Comparative Example 5 | 116 | −119 | −3 | 36 | −59 | −23 | 31 | 88 |
| Comparative Example 6 | 116 | −119 | −3 | 73 | −59 | 14 | 32 | 128 |
| Comparative Example 7 | 116 | −119 | −3 | 116 | −59 | 57 | 33 | 93 |
| Comparative Example 8 | 0 | −119 | −119 | 116 | −59 | 57 | 33 | 48 |
| Comparative Example 9 | 9 | −119 | −110 | 116 | −59 | 57 | 32 | 73 |
| Comparative Example 10 | 36 | −119 | −83 | 116 | −59 | 57 | 32 | 88 |
| Comparative Example 11 | 73 | −119 | −46 | 116 | −59 | 57 | 31 | 128 |

TABLE 1-continued

| | | | | | | | | |
|---|---|---|---|---|---|---|---|---|
| Comparative Example 12 | 36 | −119 | −83 | 0 | 59 | 59 | 32 | 43 |
| Comparative Example 13 | 36 | 119 | 155 | 36 | 59 | 95 | 55 | 83 |
| Comparative Example 14 | 0 | 135 | 135 | 0 | 69 | 69 | 48 | 51 |
| Comparative Example 15 | 0 | −119 | −119 | 0 | −59 | −59 | 36 | 3 |
| Comparative Example 16 | 0 | −119 | −119 | 9 | −59 | −50 | 34 | 28 |
| Comparative Example 17 | — | — | — | 0 | Greater than or equal to 55 | Greater than or equal to 55 | Greater than or equal to 30 | 103 |

As shown in Table 1, the organic EL display devices of the present invention show excellent characteristics. Particularly, in a case where RthA (550) is within a range of greater than −120 nm and less than or equal to −90 nm as shown in Examples 1 to 7, it was confirmed that ΔEab becomes smaller, and therefore, the present invention exhibits more excellent effect.

In addition, in a case where a λ/2 plate and a λ/4 plate do not include an optically anisotropic layer formed of a polymer film (a case where the present invention satisfies Requirement 1) as shown in Examples 1 and 16, the thickness of a circular polarization plate becomes thinner, which is preferable. In addition, even in a case where the present invention satisfies Requirement 2, the thickness of the circular polarization plate becomes thinner, which is preferable.

In contrast, the desired effect was not obtained in comparative examples in which predetermined optical requirements are not satisfied.

EXPLANATION OF REFERENCES 10, 110: organic EL display device
12: polarizer
14, 114: λ/2 plate
16, 116: λ/4 plate
18, 118: circular polarization plate
20: touch panel
22: organic EL display element
24: first optically anisotropic layer
26: second optically anisotropic layer
28: third optically anisotropic layer
30: fourth optically anisotropic layer
50: first insulating layer
52: transparent electrode layer
54: second insulating layer
56: substrate
60: first electrode
62: organic light emitting layer
64: second electrode
66: substrate
70: gas barrier layer
72: first inorganic film
74: first organic film
76: second inorganic film
78: second organic film

What is claimed is:

1. An organic electroluminescence display device comprising, from a visible side, at least:
a circular polarization plate; and
an organic electroluminescence display element having a pair of electrodes and an organic light emitting layer sandwiched therebetween,
wherein a high refractive index layer having a refractive index of greater than 1.7 and less than 2.1 is disposed between the circular polarization plate and one of the pair of electrodes, which is positioned on the visible side,
wherein the circular polarization plate has a polarizer, a λ/2 plate, and a λ/4 plate in this order from the visible side,
wherein a retardation RthA (550) of the λ/2 plate in a thickness direction at a wavelength of 550 nm is within a range of greater than −120 nm and less than −40 nm,
wherein a retardation RthB (550) of the λ/4 plate in a thickness direction at a wavelength of 550 nm is within a range of greater than −60 nm and less than 20 nm, and
wherein the λ/2 plate and the λ/4 plate satisfy Requirement 2 described below:
Requirement 2: to include an optically anisotropic layer of which a retardation RthC (550) in a thickness direction at a wavelength of 550 nm indicates 0 to 20 nm and which is formed of a polymer film.

2. The organic electroluminescence display device according to claim 1,
wherein the retardation RthA (550) is within a range of greater than −120 nm and less than or equal to −90 nm.

3. The organic electroluminescence display device according to claim 1, further comprising:
a touch panel between the circular polarization plate and the organic electroluminescence display element,
wherein the touch panel includes the high refractive index layer.

4. The organic electroluminescence display device according to claim 3,
wherein the high refractive index layer constitutes a transparent electrode layer of the touch panel.

5. The organic electroluminescence display device according to claim 1, further comprising:
a gas barrier layer between the circular polarization plate and the organic electroluminescence display element,
wherein the gas barrier layer includes the high refractive index layer.

6. The organic electroluminescence display device according to claim 2, further comprising:
a touch panel between the circular polarization plate and the organic electroluminescence display element, wherein the touch panel includes the high refractive index layer.

7. The organic electroluminescence display device according to claim 6,
wherein the high refractive index layer constitutes a transparent electrode layer of the touch panel.

8. The organic electroluminescence display device according to claim 2, further comprising:
a gas barrier layer between the circular polarization plate and the organic electroluminescence display element,
wherein the gas barrier layer includes the high refractive index layer.

* * * * *